United States Patent
Chen et al.

(10) Patent No.: US 7,435,652 B1
(45) Date of Patent: Oct. 14, 2008

(54) INTEGRATION SCHEMES FOR FABRICATING POLYSILICON GATE MOSFET AND HIGH-K DIELECTRIC METAL GATE MOSFET

(75) Inventors: Tze-chiang Chen, Yorktown Heights, NY (US); Bruce B. Doris, Brewster, NY (US); Rangarajan Jagannathan, Hopewell Junction, NY (US); Hongwen Yan, Somers, NY (US); Qingyun Yang, Poughkeepsie, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 11/694,104

(22) Filed: Mar. 30, 2007

(51) Int. Cl.
*H01L 21/336* (2006.01)
(52) U.S. Cl. ........................ 438/275; 438/592; 257/392; 257/407; 257/412; 257/E21.623
(58) Field of Classification Search ................. 438/275, 438/592, 353; 257/392, 407, 412, E21.623
See application file for complete search history.

(56) References Cited

U.S. PATENT DOCUMENTS

| | | | |
|---|---|---|---|
| 6,255,698 B1 * | 7/2001 | Gardner et al. | 257/369 |
| 6,518,106 B2 * | 2/2003 | Ngai et al. | 438/157 |
| 6,518,154 B1 * | 2/2003 | Buynoski et al. | 438/585 |
| 6,586,288 B2 * | 7/2003 | Kim et al. | 438/183 |
| 6,645,818 B1 * | 11/2003 | Sing et al. | 438/275 |
| 6,746,943 B2 | 6/2004 | Takayanagi et al. | |
| 6,794,234 B2 | 9/2004 | Polishchuk et al. | |
| 6,794,281 B2 * | 9/2004 | Madhukar et al. | 438/592 |
| 6,828,181 B2 * | 12/2004 | Chen et al. | 438/199 |
| 6,893,924 B2 * | 5/2005 | Visokay | 438/275 |
| 7,081,656 B2 * | 7/2006 | Eppich et al. | 257/392 |
| 7,148,548 B2 * | 12/2006 | Doczy et al. | 257/407 |
| 2002/0113294 A1 | 8/2002 | Rhee et al. | |
| 2005/0272191 A1 * | 12/2005 | Shah et al. | 438/197 |
| 2005/0275035 A1 * | 12/2005 | Mathew et al. | 257/369 |
| 2005/0282329 A1 * | 12/2005 | Li | 438/216 |
| 2006/0008968 A1 * | 1/2006 | Brask et al. | 438/206 |
| 2006/0017098 A1 * | 1/2006 | Doczy et al. | 257/330 |
| 2006/0071285 A1 * | 4/2006 | Datta et al. | 257/407 |
| 2007/0272975 A1 * | 11/2007 | Schaeffer et al. | 257/327 |

* cited by examiner

*Primary Examiner*—George Fourson
(74) *Attorney, Agent, or Firm*—Scully, Scott, Murphy & Presser, P.C.; Robert M. Trepp, Esq.

(57) ABSTRACT

Multiple integration schemes for manufacturing dual gate semiconductor structures are disclosed. By employing the novel integration schemes, polysilicon gate MOSFETs and high-k dielectric metal gate MOSFETs are formed on the same semiconductor substrate despite differences in the composition of the gate stack and resulting differences in the etch rates. A thin polysilicon layer is used for one type of gate electrodes and a silicon-containing layer are used for the other type of gate electrodes in these integration schemes to balance the different etch rates and to enable etching of the two different gate stacks.

20 Claims, 22 Drawing Sheets

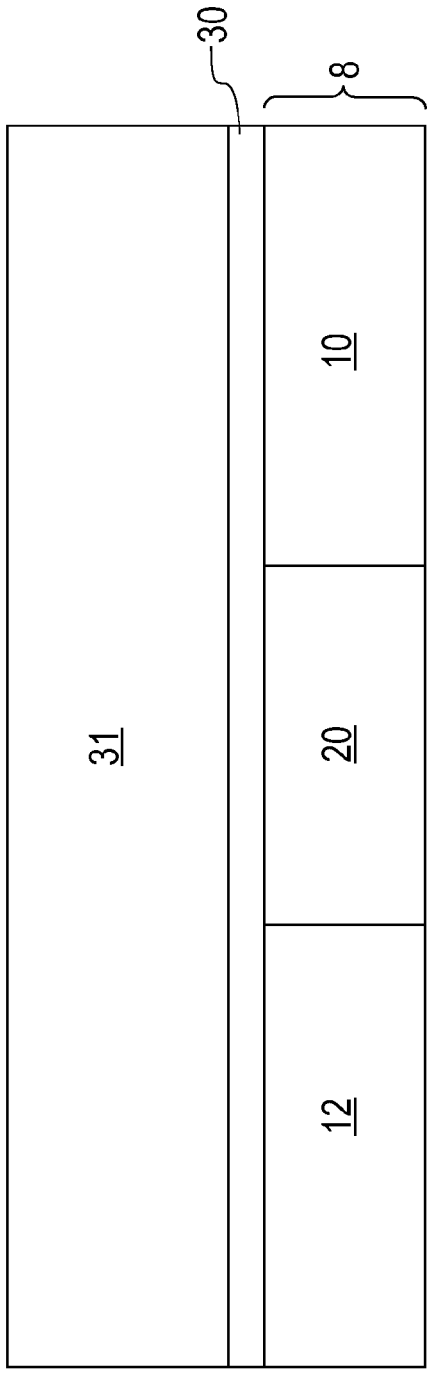
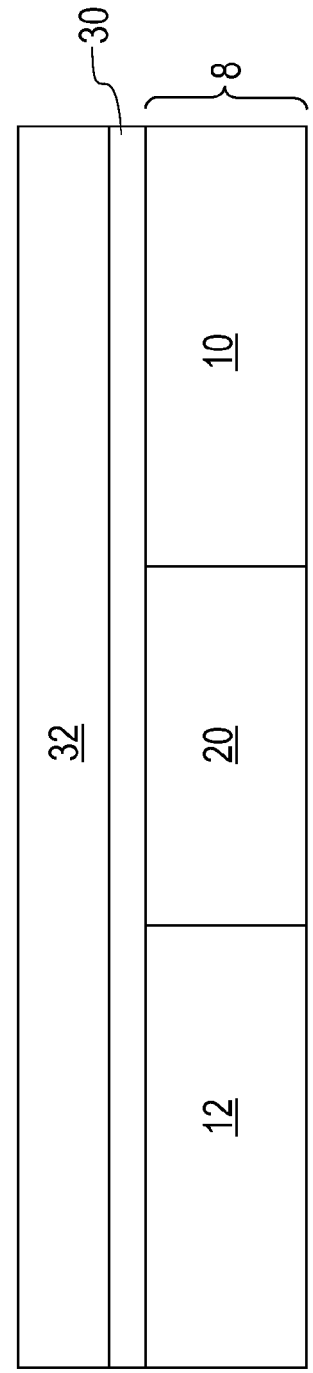

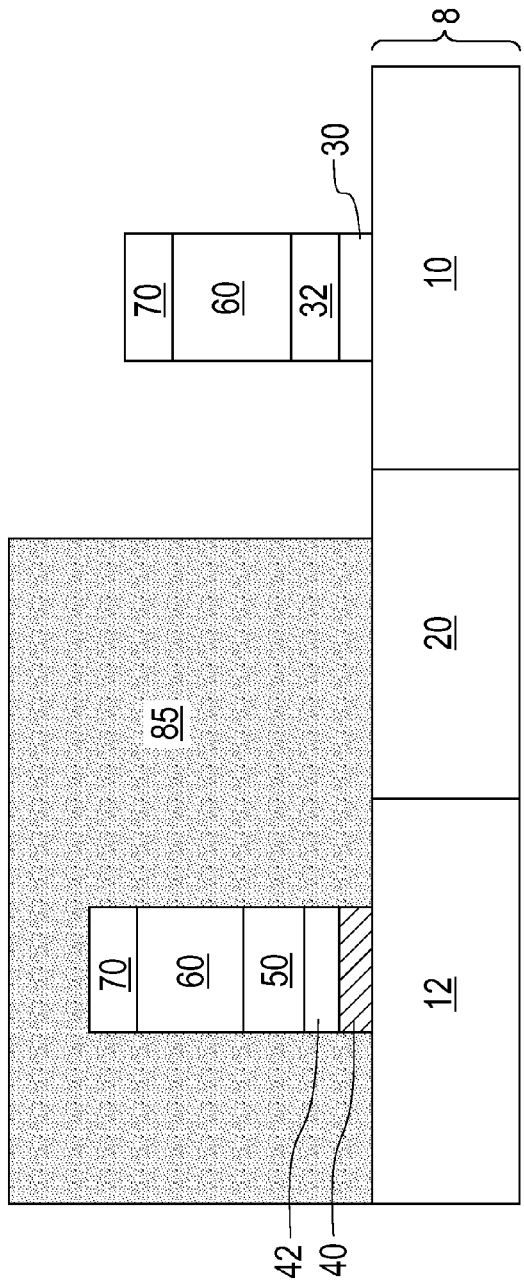
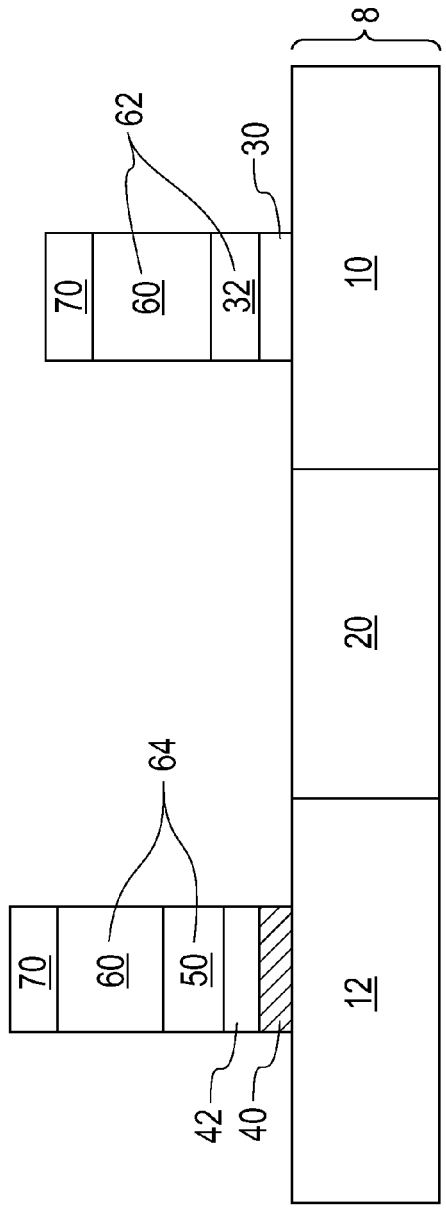
FIG. 20
FIG. 21

INTEGRATION SCHEMES FOR FABRICATING POLYSILICON GATE MOSFET AND HIGH-K DIELECTRIC METAL GATE MOSFET

FIELD OF THE INVENTION

The present invention relates to methods of fabricating semiconductor structures, and particularly to methods of fabricating semiconductor structures having a polysilicon gate MOSFET and a high-K dielectric metal gate MOSFET on the same semiconductor substrate.

BACKGROUND OF THE INVENTION

Enhancement of complementary metal oxide semiconductor (CMOS) circuit requires improvement in the performance of both the p-type metal oxide semiconductor field effect transistors (PMOSFETs) and n-type metal oxide semiconductor field effect transistors (NMOSFETs). While the same material and processing steps were shared between PMOSFETs and NMOSFETs in the past, recent trends in high performance PMOSFETs and NMOSFETs show increased use of different materials and different processing steps among the two types of transistors.

An example in which differences in the manufacture of the transistors are preferred is in the selection of the gate conductor material. In the case of an NMOSFET, it is preferred that a work function of a gate electrode material is close to a conduction band edge. In contrast, in the case of a PMOSFET, it is preferred that a work function of a gate electrode material is close to a balance band edge. Since the conduction band edge is separated by the balance band edge by a band gap in a semiconductor material, the work function of the gate electrode material for the PMOSFET needs to be different from the work function of the gate electrode material for the NMOSFET. Hence, the need arises to utilize two different gate electrode materials for a high performance CMOS circuit, in which one material is utilized for the gates of PMOSFETs while another material is utilized for the gates of the NMOSFETs.

Various CMOS device structures with two different gate electrode materials and methods of manufacturing the same have been known in the art. For example, Rhee et al., in U.S. Patent Application Publication No. 2002/0113294 discloses CMOS devices with doped silicon germanium alloy gate electrodes with differing concentration gradients of germanium between PMOSFET electrodes and NMOSFET electrodes. Similarly, Takayanagi et al., in U.S. Pat. No. 6,746,943, disclose compensation for differences in activation of p-type dopants and n-type dopants with polysilicon-germanium alloy material having different germanium concentrations between PMOSFET electrodes and NMOSFET electrodes. Further, Polishchuk et al., in U.S. Pat. No. 6,794,234 discloses CMOS devices in which PMOSFET gate electrodes comprise a first metal, while NMOSFET gate electrodes comprise a second metal. Some of the prior art listed above also enables use of at least one high-k dielectric material within metal gate structures.

Using one metal for one type of gate electrode and polysilicon for another type of gate electrode is an alternative to the above listed prior art. An advantage of such an approach is that process integration is less complex compared to integration schemes that utilize two metal gate materials since processing of each metal gate material tends to introduce challenges. At the same time, utilization of a metal gate offers a control mechanism for gate work function that is effective enough to achieve substantial improvement in the performance of one type of transistors.

Since the use of a metal gate electrode with a high-K dielectric often introduces additional challenging, and oftentimes costly, processing steps, improvement of device performance through use of a metal gate electrode needs to be evaluated against the cost of the additional processes. For example, performance of NMOSFETs may improve significantly with the use of a metal gate electrode and a high-K dielectric to justify the associated additional cost while improvement of performance of PMOSFETs may not be sufficient to justify associated incremental cost.

Therefore, there exists a need for integration schemes that employ a metal gate material and a high-K dielectric on one type of MOSFET while utilizing a polysilicon gate on the other type of MOSFET.

Furthermore, there exists a need for integration schemes that manufacture a high-K dielectric metal gate MOSFET and a polysilicon gate MOSFET on the same semiconductor substrate with as little additional process complexity and processing cost as possible.

SUMMARY OF THE INVENTION

The present invention addresses the needs described above by providing methods of manufacturing a semiconductor structure with a polysilicon gate electrode and a high-K dielectric metal gate electrode on the same semiconductor substrate.

A method of forming a semiconductor structure according to the present invention comprises:

forming a first stack of a first gate dielectric layer and a first polysilicon layer directly on a first portion of a semiconductor substrate;

forming a second stack of a second gate dielectric, a metal gate layer, and a silicon-containing layer directly on the first stack and on a second portion of a semiconductor substrate; and forming a second polysilicon layer directly on the first polysilicon layer and directly on the silicon-containing layer.

According to a first embodiment, a second embodiment, and a third embodiment of the present invention, the method of forming the semiconductor structure further comprises forming a gate cap dielectric layer on the second polysilicon layer.

According to the first embodiment of the present invention, the method of forming the semiconductor structure still further comprises:

forming a patterning in the first polysilicon layer over the first portion and in the silicon-containing layer over the second portion;

masking the first portion with a photoresist;

transferring the pattern into the second gate dielectric layer over the second portion;

removing the photoresist from over the first portion; and transferring the pattern into the first gate dielectric layer from over the first portion.

According to the second embodiment of the present invention, the method of forming the semiconductor structure still further comprises:

forming a patterning in the gate cap dielectric;

masking the second portion with a first photoresist;

transferring the pattern into the first polysilicon layer from over the first portion;

masking the first portion with a second photoresist;

transferring the pattern into the metal gate layer and the second gate dielectric layer over the second portion; and etching the first gate dielectric layer from the first portion.

According to the third embodiment of the present invention, the method of forming the semiconductor structure still further comprises:

forming a patterning in the gate cap dielectric;

masking the first portion with a first photoresist;

transferring the pattern into the metal gate layer and the second gate dielectric layer over the second portion;

masking the second portion with a second photoresist;

transferring the pattern into the first polysilicon layer from over the first portion; and etching the first gate dielectric layer from the first portion.

According to a fourth embodiment, of the present invention, the method of forming the semiconductor structure further comprises:

masking the first portion with a first photoresist recessing the second polysilicon layer from the second portion;

lithographically forming a pattern containing at least one first gate electrode over the first portion and at least one second gate electrode over the second portion;

transferring the pattern into the metal gate layer over the second portion and into an upper portion of the first polysilicon layer in the first portion, while not etching a lower portion of the first polysilicon layer; and transferring the pattern into the second gate dielectric layer, the lower portion of the first polysilicon layer, and the first gate dielectric layer.

According to all embodiments of the present invention, the second gate dielectric layer preferably comprises a stack of an oxide-containing dielectric layer less than about 1 nm in thickness and a high-K dielectric layer, wherein the oxide-containing dielectric layer is an oxide layer or an oxynitride layer. Further, the first gate dielectric layer preferably comprises a material selected from the group consisting of silicon oxide and silicon oxynitride.

According to all embodiments of the present invention, the first polysilicon layer is preferably formed by deposition of a blanket polysilicon layer followed by a partial etch of said blanket polysilicon layer and has a thickness in the range from about 10 nm to about 50 nm. The second gate dielectric layer preferably has a thickness in the range from about 2 nm to about 10 nm. The metal gate layer preferably has a thickness in the range from about 2 nm to about 10 nm.

According to all embodiments of the present invention, said silicon-containing layer is an amorphous silicon layer and has a thickness in the range from about 10 nm to about 50 nm, and said second polysilicon layer has a thickness in the range from about 40 nm to about 120 nm n.

According to the first through third embodiments of the present invention, and the gate cap dielectric layer preferably has a thickness in the range from about 15 nm to about 60 nm.

Optionally, the present invention may further comprise ion-bombarding the second dielectric layer prior to transferring the pattern into the second gate dielectric layer.

The present invention forms a structure with two types of gate electrodes in which at least one first gate electrode comprises a vertical stack of a first gate dielectric layer, a first polysilicon layer, and a second polysilicon layer while at least one second gate electrode comprises a second gate dielectric layer, a metal gate layer, a silicon-containing layer, and a second polysilicon layer. Both gate electrodes may have a gate cap dielectric layer on top of the second polysilicon layer. The silicon-containing layer preferably contains amorphous silicon, and more preferably, is an amorphous silicon layer.

BRIEF DESCRIPTION OF THE DRAWINGS

FIGS. 1-6 are sequential vertical cross-sectional views of an exemplary semiconductor structure according to the first through fourth embodiments of the present invention.

FIGS. 17-21 are sequential vertical cross-sectional views of the exemplary semiconductor structure according to the third embodiment of the present invention.

DETAILED DESCRIPTION OF THE INVENTION

Figure 3:
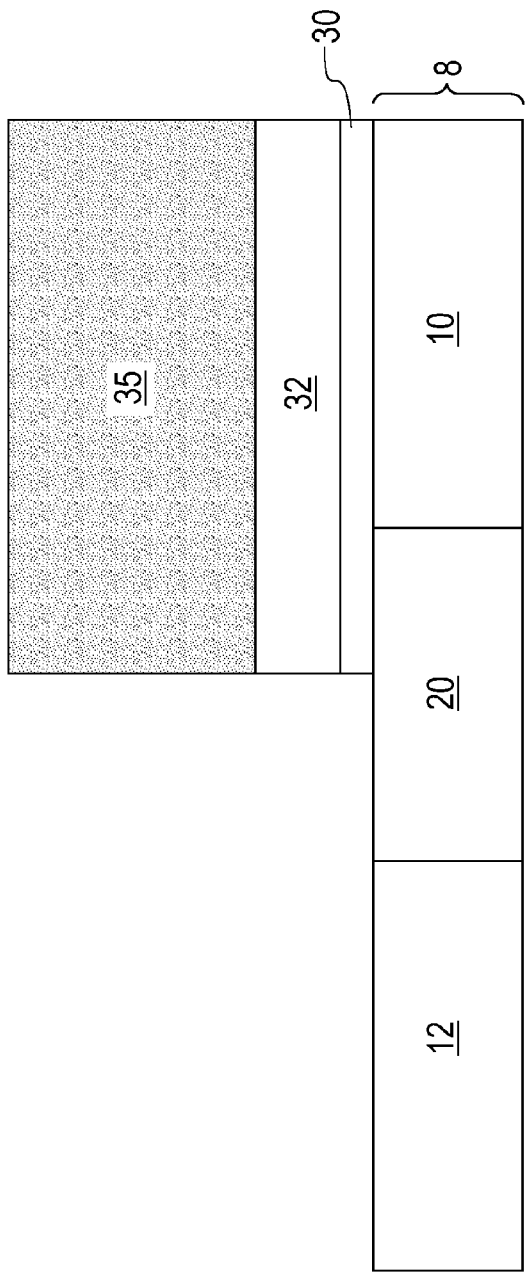

As stated above, the present invention relates to methods of manufacturing a semiconductor structures with at least one polysilicon gate electrode and at least one high-K dielectric metal gate electrode, which will now be described in greater detail by referring to the drawings that accompany the present application.

According to FIGS. 1-6, a series of vertical cross-sectional views demonstrating formation of an exemplary semiconductor structure with a polysilicon gate electrode, a high-K dielectric metal gate electrode, and shallow trench isolation are sequentially shown. FIGS. 1-6 are common processing steps according to the four embodiments of the present invention to be shown below. The non-limiting four embodiments of the present invention are shown for demonstration of the practicability of the present invention and obvious alterations and variations of these methods are implied in the present disclosure. Manufacture of more than two gate electrodes according to the spirit of the present invention is straightforward to one of ordinary skill in the art, and such applications are also implied herein.

Referring to FIG. 1, there is shown a semiconductor substrate 8 which comprises a first portion 10, a second portion 12, and shallow trench isolation 20 between the two portions (10, 12). The first portion 10 and the second portion 12 may have the same crystallographic orientations, which is the case for a bulk substrate or a non-hybrid silicon-on-insulator (SOI) substrate, or they may have different crystallographic orientations, which is the case for a hybrid orientation substrate with or without a buried oxide layer. It is preferred that the first portion 10 and the second portion 12 have different crystallographic orientations. For example, the first portion may have a (110) surface orientation and the second portion may have an (100) orientation. While the present invention is demonstrated with a polysilicon gate on the first portion 10 and with a high-K dielectric metal gate on the second portion 12, reversing the two portions (10, 12) is also straightforward. Further, changing the crystallographic orientations of each portion to any of the major crystallographic orientations such as (100), (110), (11), (211), (221), (311), and (331) is also practicable and is herein explicitly contemplated.

A first gate dielectric layer 30 is formed over the first portion 10, the second portion 12, and the shallow trench isolation 20. The first gate dielectric layer 30 may be a conventional dielectric layer and, for example, may comprise a material selected from the group consisting of silicon oxide and silicon oxynitride.

Preferably, a blanket polysilicon layer 31 is deposited as shown in FIG. 1 and thinned to a first polysilicon layer 32 as shown in FIG. 2. Alternatively, the first polysilicon layer 32 may be deposited with the required thickness The first polysilicon layer 32 is preferably formed by deposition of a blanket polysilicon layer 31 followed by a partial etch of the blanket polysilicon layer 31. The first polysilicon layer 32 preferably has a thickness in the range from about 10 nm to about 50 nm. The thickness of the blanket polysilicon layer 31 as deposited is greater than 50 nm to insure continuity of the film and is preferably in the range from about 60 nm to about 200 nm. The first polysilicon layer 32 is preferably undoped.

Referring to FIG. 3, a first photoresist 35 is applied to the top surface of the semiconductor structure above and lithographically patterned to block the first portion 10 of the semiconductor substrate 8, while exposing the second portion 12 of the semiconductor substrate 8. The exposed portions of the first polysilicon layer 32 and the first gate dielectric layer 30 over the second portion 12 of the semiconductor substrate 8 are etched preferably by a first reactive ion etch (RIE).

Figure 4:
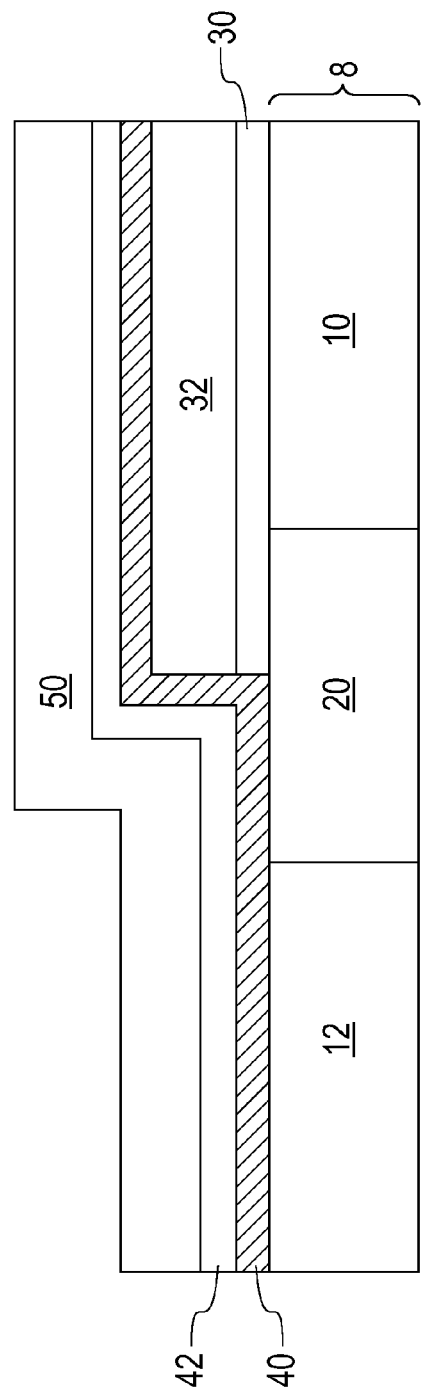

Referring to FIG. 4, a stack of a second gate dielectric layer 40 and a metal gate layer 42 are formed directly on the remaining first polysilicon layer 32 over the first portion 10 of the semiconductor substrate 8 and on the exposed semiconductor surface of the second portion 12 of the semiconductor substrate 8. Preferably, the second gate dielectric layer 40 comprises a stack of an oxide-containing dielectric layer less than about 1 nm in thickness and a high-K dielectric layer. The oxide containing dielectric layer contacts the exposed semiconductor surface of the second portion 12. The oxide containing dielectric layer may be a silicon oxide layer, a silicon oxynitride layer, or a stack of at least one oxide layer and at least one nitride layer. The high-K dielectric layer may comprise a metal oxide such as $HfO_2$, $ZrO_2$, $Al_2O_3$, $TiO_2$, $La_2O_3$, $SrTiO_3$, and $LaAlO_3$. Alternatively, the high-K dielectric layer may comprise hafnium silicates, barium-strontium-titantates (BSTs) or lead-zirconate-titanates (PZTs). The gate dielectric materials may be formed by atomic layer deposition (ALD)), thermal or plasma oxidation, thermal or plasma nitridation, chemical vapor deposition (CVD), and physical vapor deposition (PVD). The total thickness of the second gate dielectric layer 40 is in the range from about 2 (1 nm) nm to about 10 nm, and preferably in the range from about 2 (1 nm) nm to about 5 nm.

A metal gate layer 42 is formed directly on top of the second gate dielectric 40. The metal gate layer 42 may comprise base metals, metal alloys or conductive refractory metal nitrides such as TaN, TiN, and WN. The material for the metal gate layer 42 is selected for optimal work function for the MOSFET device to be built over the second portion 12 of the semiconductor substrate 8. Preferably, the thickness of the metal gate layer 42 is in the range from about 2 nm to about 10 nm.

A silicon-containing layer 50 is formed directly on the top of the metal gate layer 42. The silicon-containing layer 50 may be an amorphous silicon layer, a polysilicon layer, an amorphous silicon alloy, or a polycrystalline silicon alloy. Preferably, the silicon-containing layer 50 is an amorphous silicon layer. The thickness of the silicon-containing layer 50 may be in the range from about 10 nm to about 50 nm. Preferably, the silicon-containing layer 50 is not doped.

Figure 5:
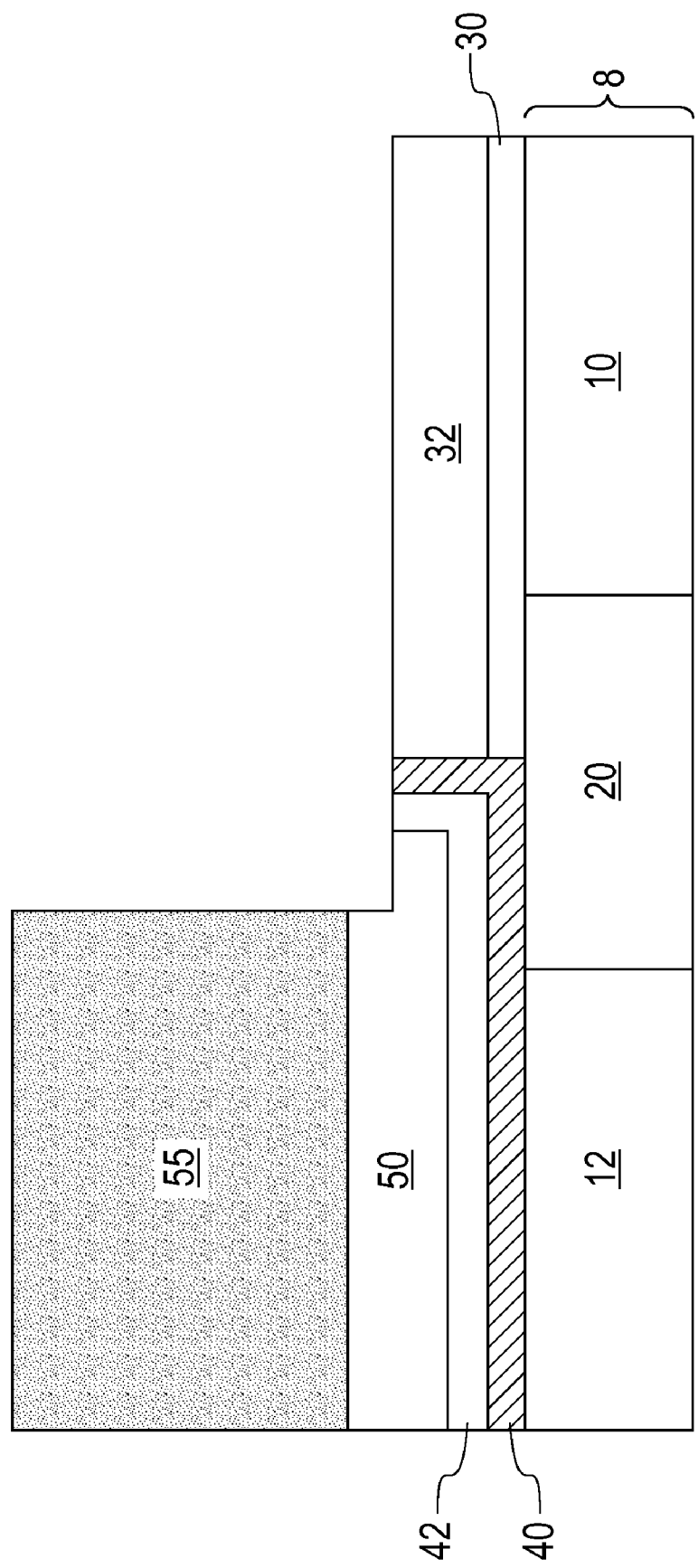

Referring to FIG. 5, a second photoresist 55 is applied to the top surface of the semiconductor structure above and lithographically patterned to block the portion of the silicon-containing layer 50 over the second portion 12 of the semiconductor substrate 8 while exposing the area over the first portion 10. The exposed portion of the stack of the silicon-containing layer 50, the metal gate layer 42, and the second gate dielectric layer 40, is etched preferably by a second reactive ion etch (RIE) and removed from over the first portion 10 of the semiconductor substrate 8. The second photoresist 55 is thereafter removed. The top surface of the silicon-containing silicon layer 50 over the second portion 12 of the semiconductor substrate 8 may be higher as shown in FIG. 5 or may be lower than the top surface of the first polysilicon layer 32 over the first portion 10 depending on the thickness of the various layers. Alternatively, both surfaces may be substantially at the same level with a minimal or no step height.

Figure 6:
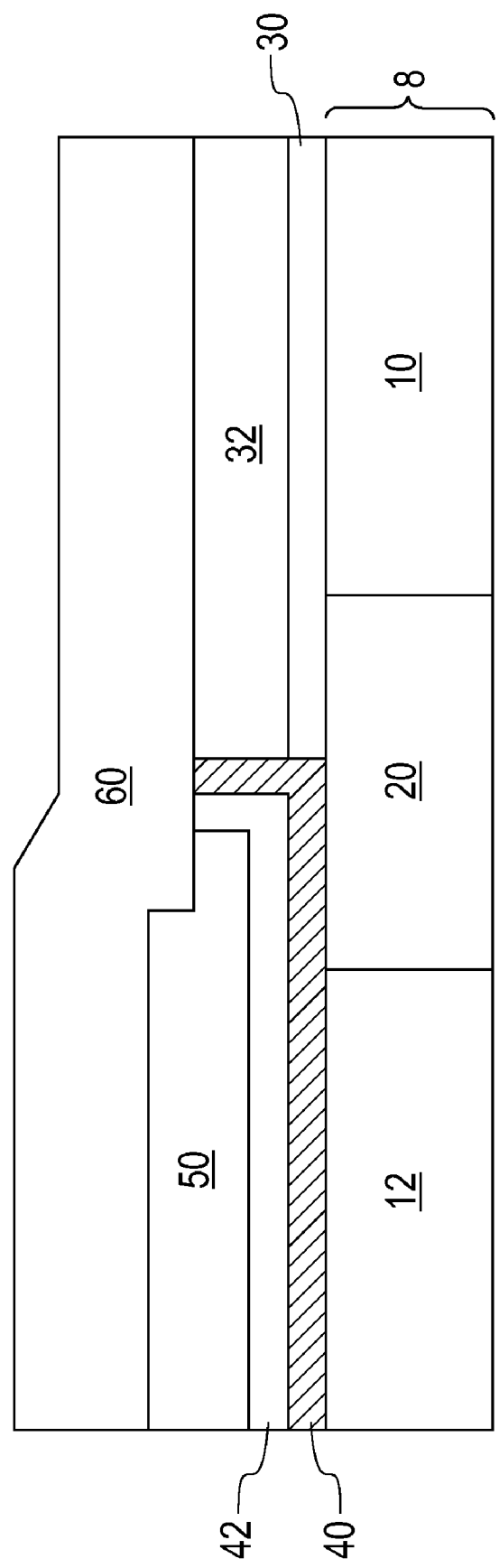

Referring to FIG. 6, a second polysilicon layer 60 is formed on the first polysilicon layer 32 over the first portion 10 and on the silicon-containing layer 50 over the second portion of the semiconductor substrate 8. The first polysilicon layer 60 preferably has a thickness in the range from about 40 nm to about 120 nm. The second polysilicon layer 60 is preferably undoped. (The second polysilicon layer 60 is preferably doped on second portion 12) Features of the step, such as height and direction of the step, in the silicon-containing-layer 50 are carried over to the step on the top surface of the second polysilicon layer 60.

According to the first through third embodiments of the present invention, a gate cap dielectric layer 70 is deposited on the second polysilicon layer 60. The gate cap dielectric layer 70 typically comprises a silicon oxide, silicon nitride or a stack thereof. Preferably, the gate cap dielectric layer 70 is a silicon oxide layer (should be silicon nitride). More preferably, the gate cap dielectric layer 70 is a TEOS oxide layer (delete this sentence). The gate cap dielectric layer has a thickness in the range from about 15 nm to about 60 nm.

Figure 7:
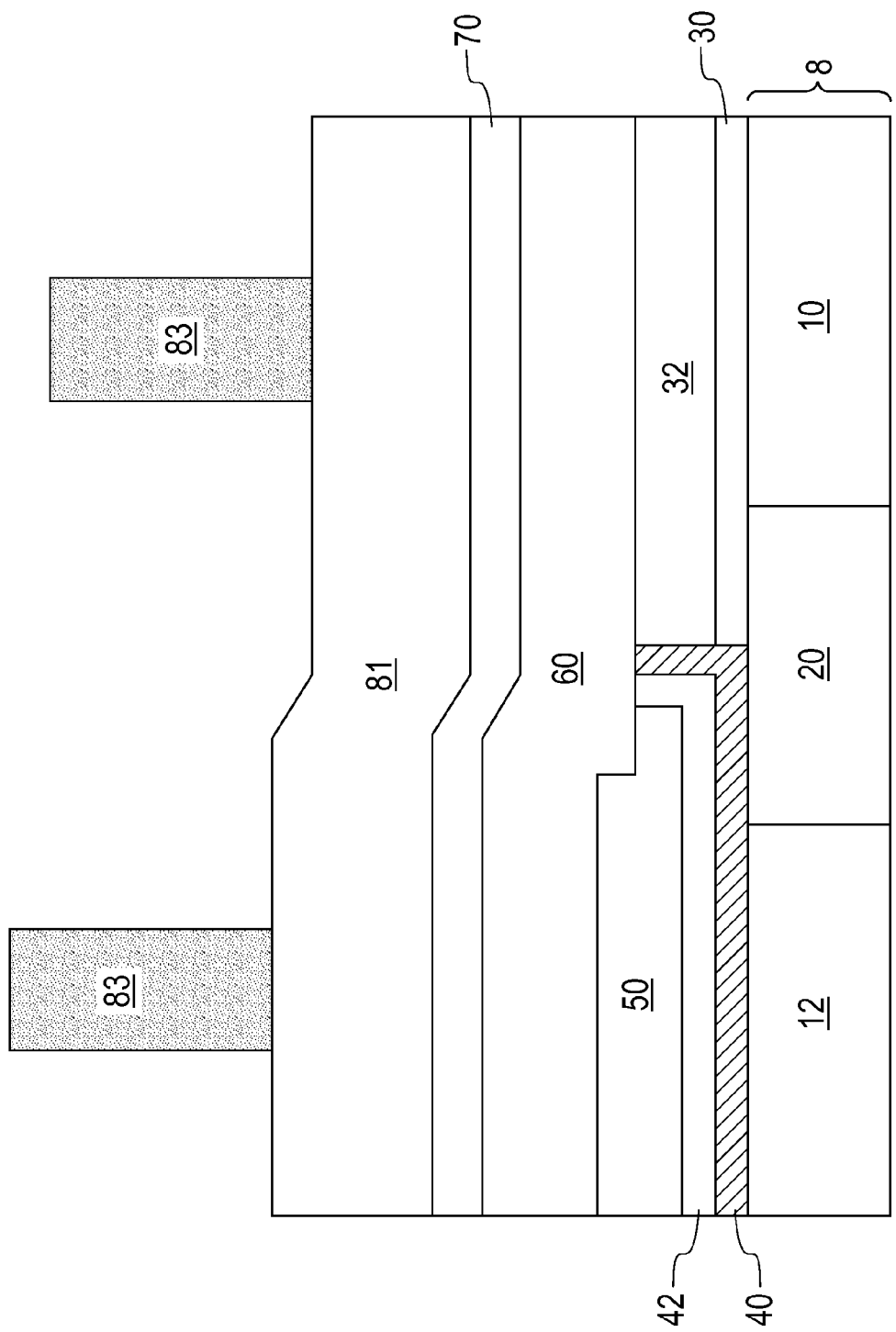
FIG. 7 is a vertical cross-sectional view of the exemplary semiconductor structure according to the first through third embodiments of the present invention.

An anti-reflective coating (ARC) layer 81 and a third photoresist 83 are applied over the top surface of the gate cap dielectric layer 70. The third photoresist 83 is subsequently lithographically patterned as shown in FIG. 7. The pattern in the third photoresist 83 contains at least one first gate electrode over the first portion 10 and at least one second gate electrode over the second portion 12 of the semiconductor substrate 8. The thickness of the ARC layer 81 is preferably in the range from about 60 nm to about 120 nm.

Figure 8:
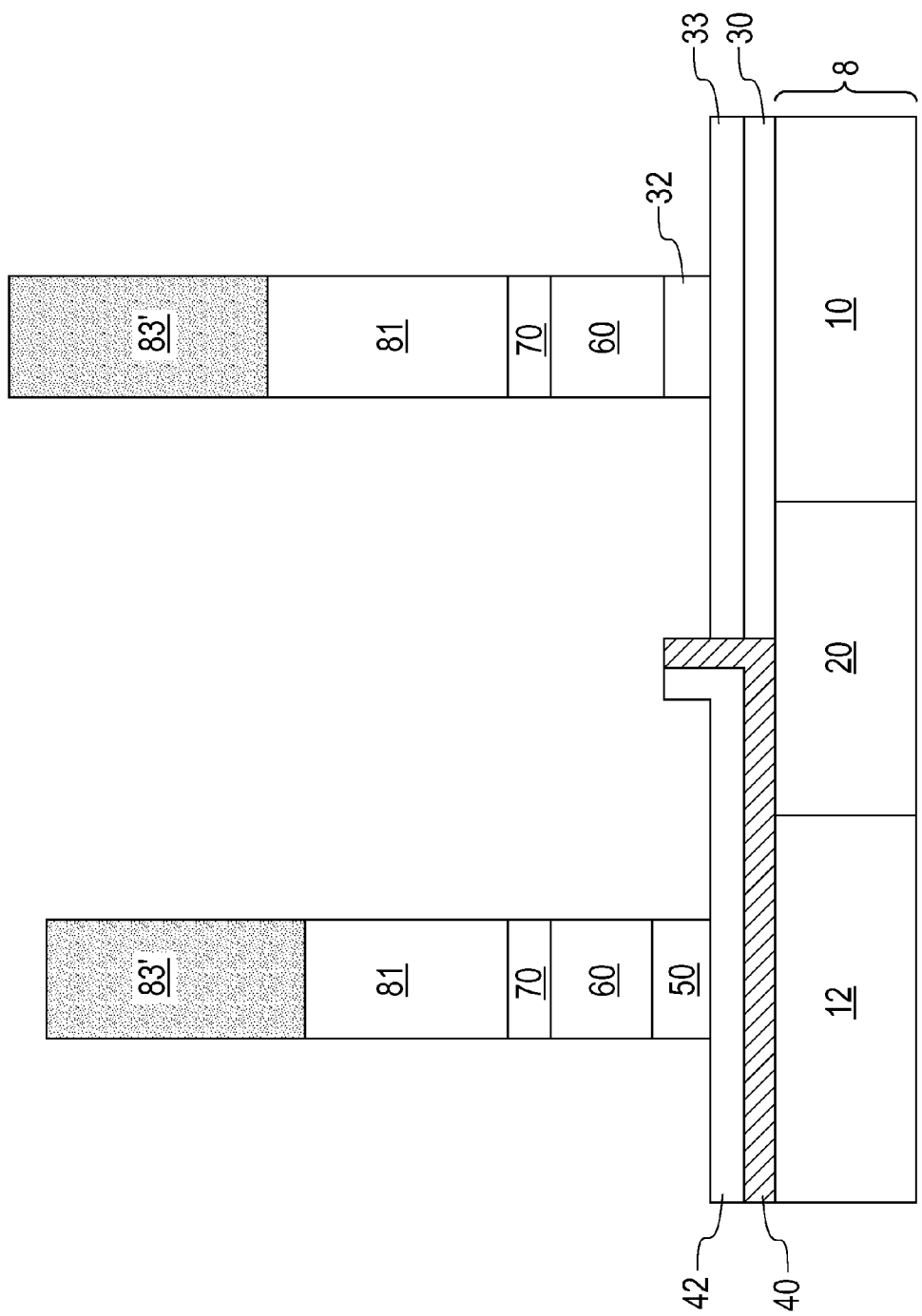
FIGS. 8-10 are sequential vertical cross-sectional views of the exemplary semiconductor structure according to the first embodiment of the present invention.

According to the first embodiment of the present invention, the pattern in the third photoresist 83 is transferred into the underlying layers, specifically, into a stack comprising the ARC layer 81, the gate cap dielectric layer 70, the second polysilicon layer 60, and the first polysilicon layer 32 over the first portion 12 and into a stack comprising the ARC layer 81, the gate cap dielectric layer 70, the second polysilicon layer 60, and the silicon-containing layer 50 over the second portion 10 of the semiconductor substrate 8 by a third reactive ion etch (RIE) as shown in FIG. 8. The third RIE stops on the surface of the first gate dielectric 30 over the first portion 10 and on the surface of the metal gate layer 42 over the second portion 12 of the semiconductor substrate 8. The remaining third photoresist 83' and the ARC layer 81 are removed thereafter.

Figure 9:
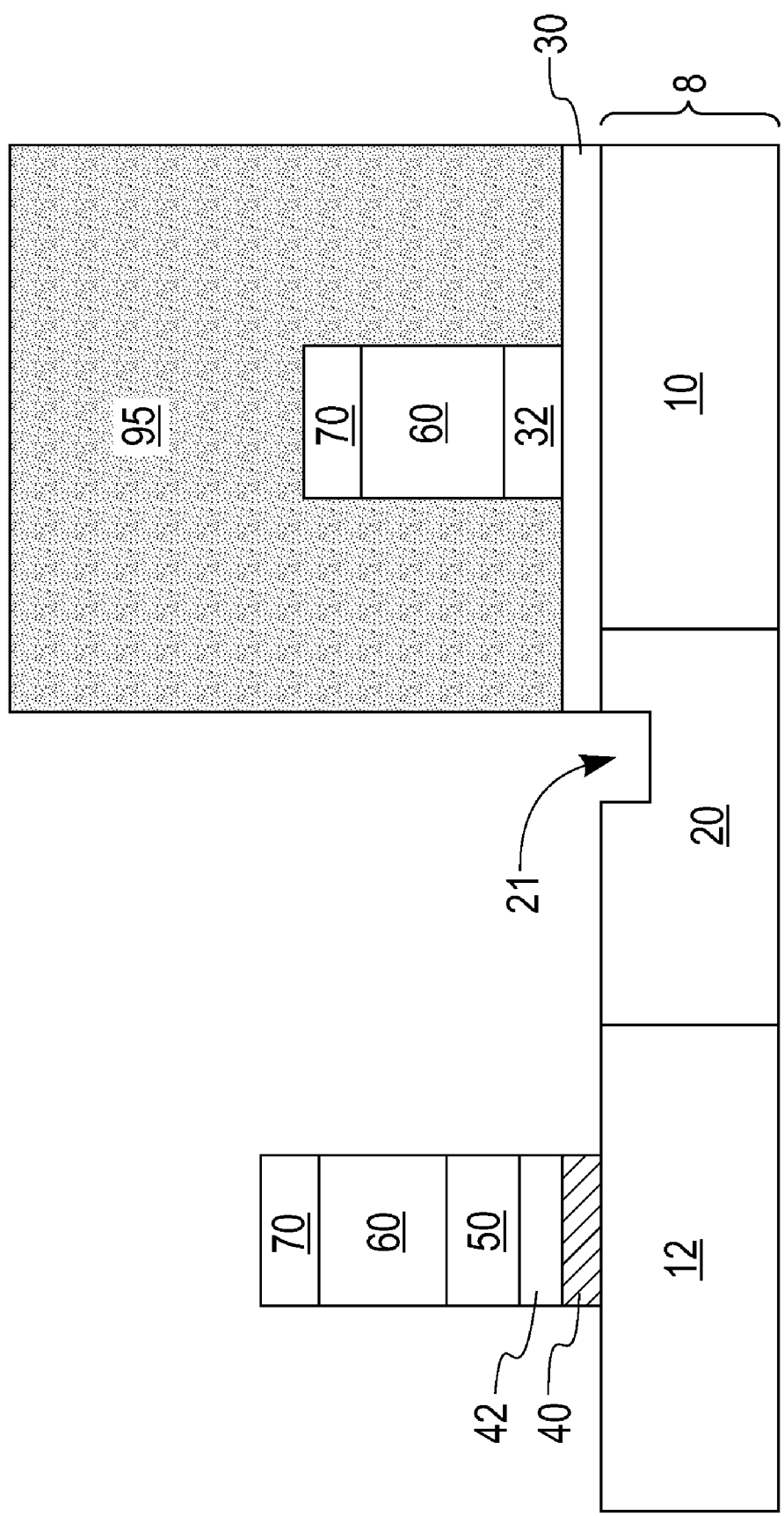

Referring to FIG. 9, a block photoresist 95 is applied and lithographically patterned to block the at least one stack of the gate cap dielectric layer 70, the second polysilicon layer 60, and the first polysilicon layer 32 as well as the underlying first gate dielectric 30 over the first portion 10 of the semiconductor substrate 8. The semiconductor structure over the second portion 12 of the semiconductor substrate 8 is exposed at this point. The exposed portions of the metal gate layer 42 is etched by a fourth reactive ion etch (RIE) at this point.

Preferably, ion-bombardment of the second gate dielectric 40 follows the fourth etch while the semiconductor structure over the first portion 10 is covered by the fourth photoresist 95. Inert ion species such as Ar, Xe, and Kr may be used to loosen the high-K dielectric layer portion of the second dielectric layer 40 and facilitate subsequent etching. The second dielectric layer 40 is thereafter etched by a fifth reactive ion etch (RIE). Thereafter, the block photoresist 95 is removed.

Figure 10:
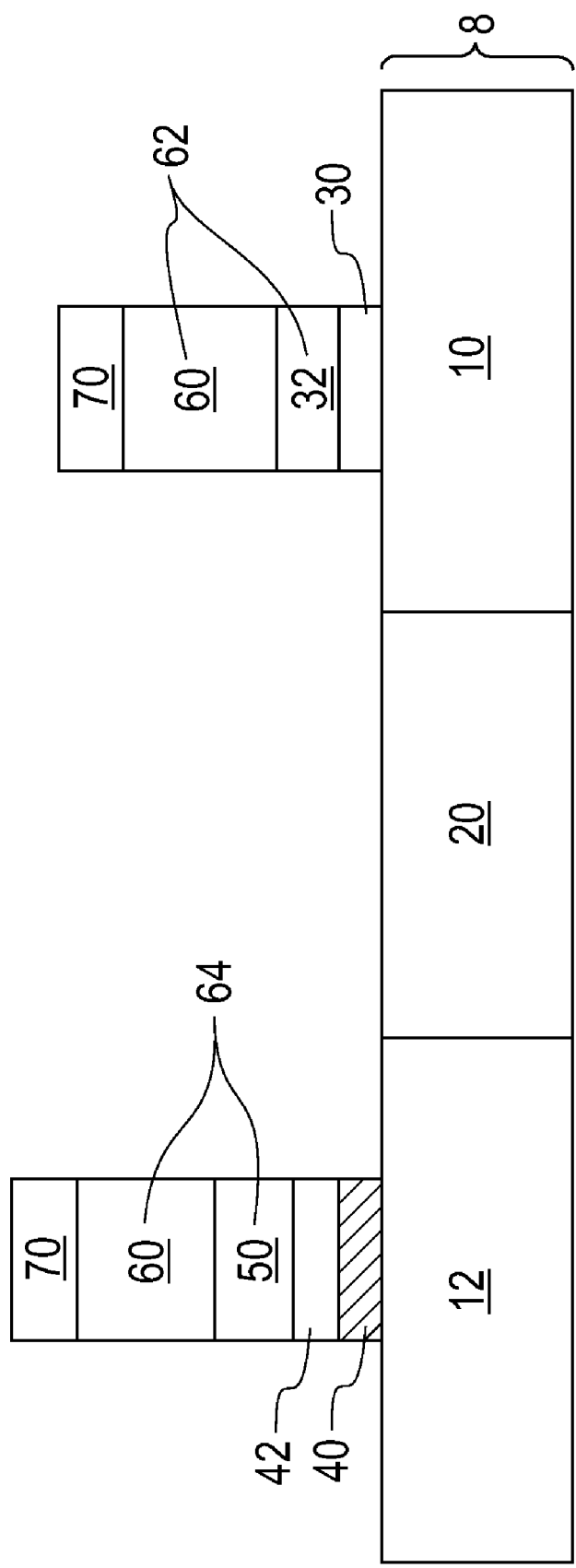

Referring to FIG. 10, the exposed portion of the first dielectric layer 30 is etched either by a wet etch or by a reactive ion etch. The resulting exemplary semiconductor structure has a first gate electrode which comprises a first gate dielectric layer 30, a first gate conductor stack 62, and a gate cap dielectric layer 70. The first gate conductor stack 62 comprises a first gate polysilicon layer 32 and a second gate polysilicon layer 60. The resulting exemplary semiconductor structure also has a second gate electrode which comprises a second gate dielectric layer 40, a metal gate layer 42, a second gate conductor stack 64, and a gate cap dielectric layer 70. The second gate conductor stack 64 comprises a silicon-containing layer 50 and a second gate polysilicon layer 60. Preferably, the silicon-containing layer 50 is an amorphous silicon layer.

Figure 11:
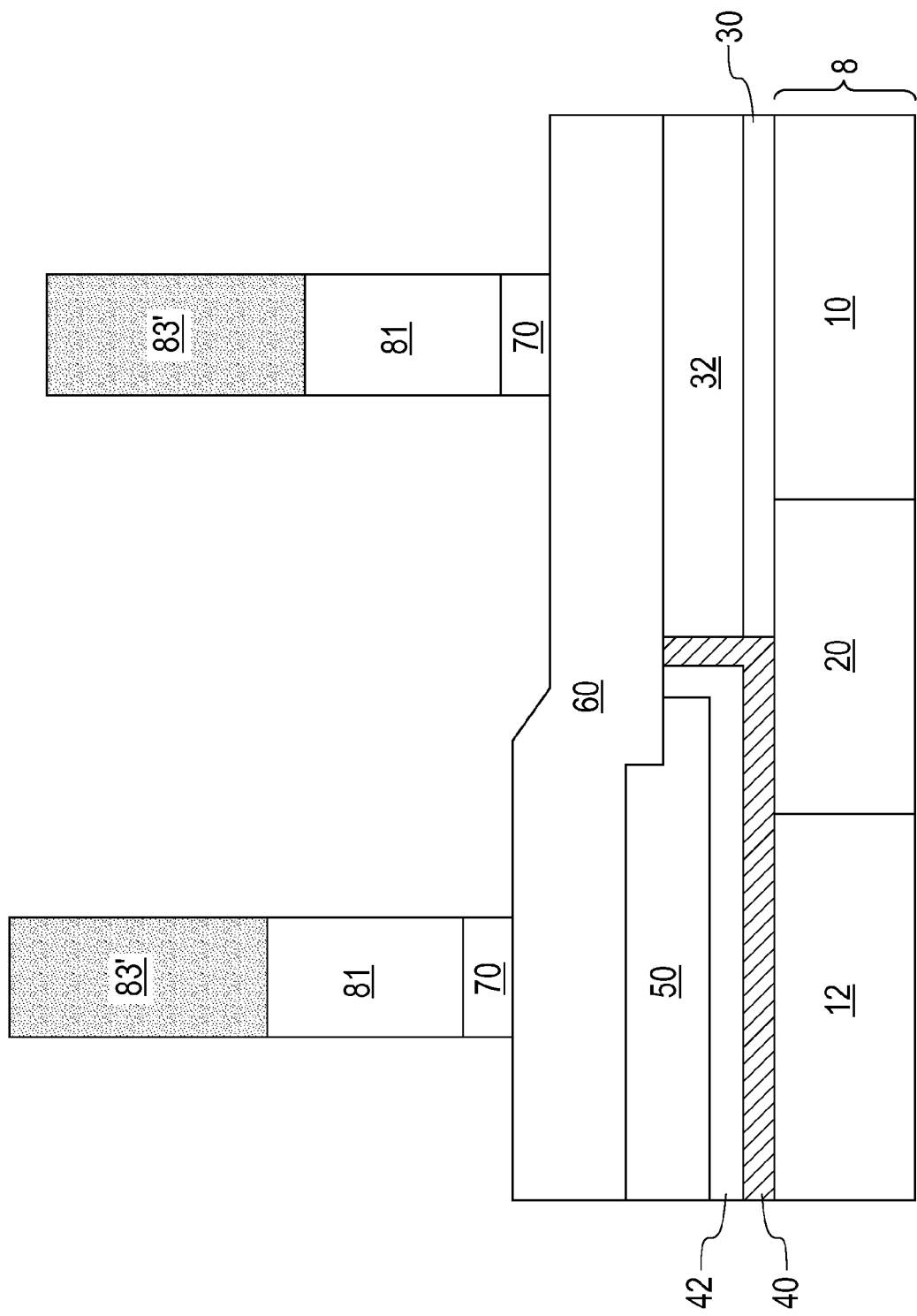
FIG. 11 is a vertical cross-sectional view of the exemplary semiconductor structure according to the second and third embodiments of the present invention.

According to the second embodiment of the present invention, the initial processing steps corresponding to FIGS. 1-7 are identical to those according to the first embodiment of the present invention. Thereafter, the pattern in the third photoresist 83 is transferred into the stack comprising the ARC layer 81 and the gate cap dielectric layer 70. Unlike the first embodiment, however, the pattern transfer stops on top of the second polysilicon layer 60 after the third RIE as shown in FIG. 11 according to the second embodiment of the present invention. The remaining third photoresist 83' and the ARC layer 81 are thereafter removed.

Figure 12:
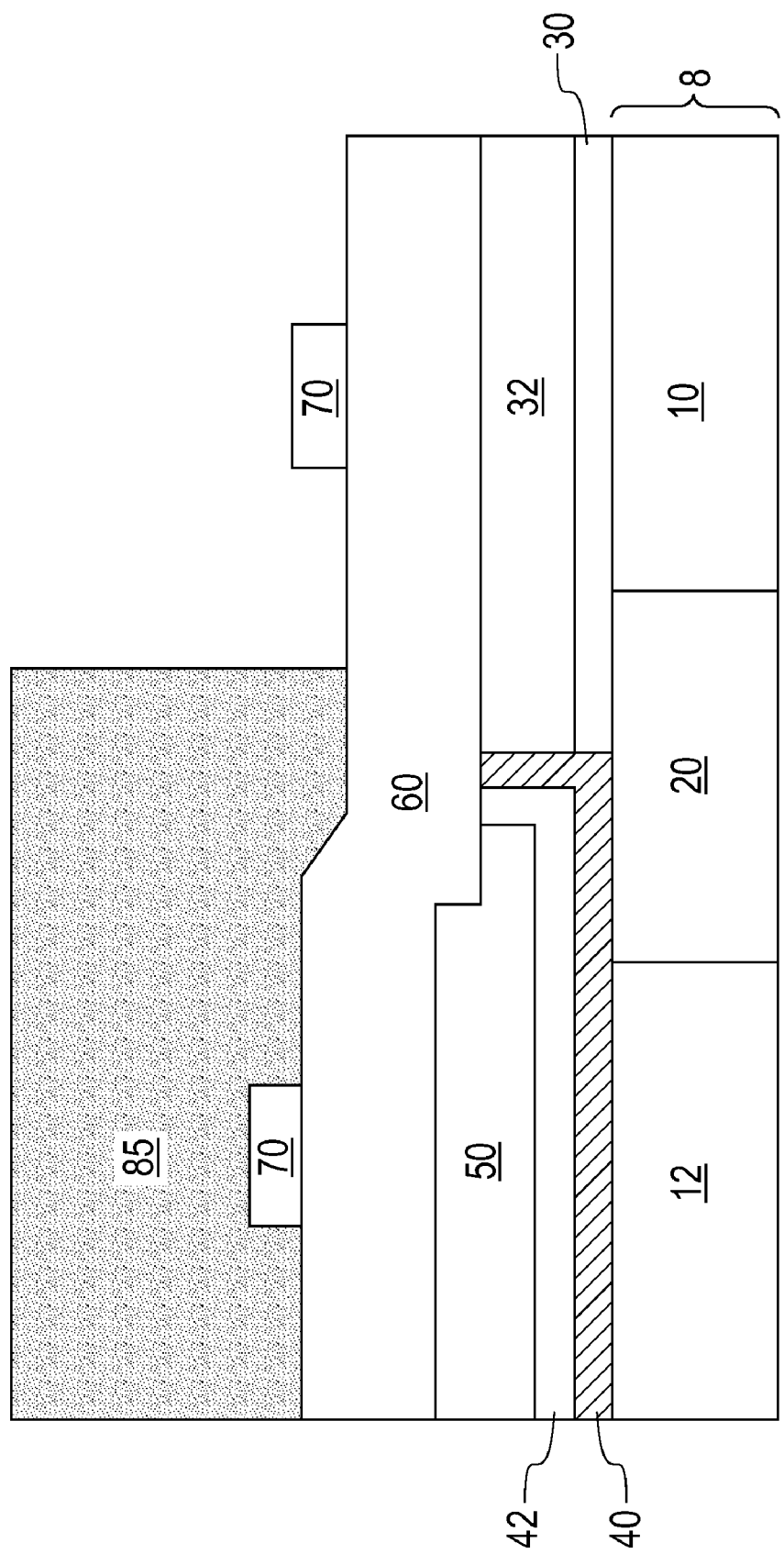
FIGS. 12-16 are sequential vertical cross-sectional views of the exemplary semiconductor structure according to the second embodiment of the present invention.

Referring to FIG. 12, a fourth photoresist 85 is applied over the patterned gate cap dielectric layer 70 and over the underlying second polysilicon layer 60. The fourth photoresist 85 is subsequently lithographically patterned so that the semiconductor structure over the second portion 12 of the semiconductor substrate 8 is covered while the area over the first portion 10 is exposed. Preferably, the edge of the fourth photoresist 85 extends over the boundary between the remaining second gate dielectric layer 40 and the remaining first gate dielectric layer 30 so that the boundary is underneath the patterned fourth photoresist 85.

Figure 13:
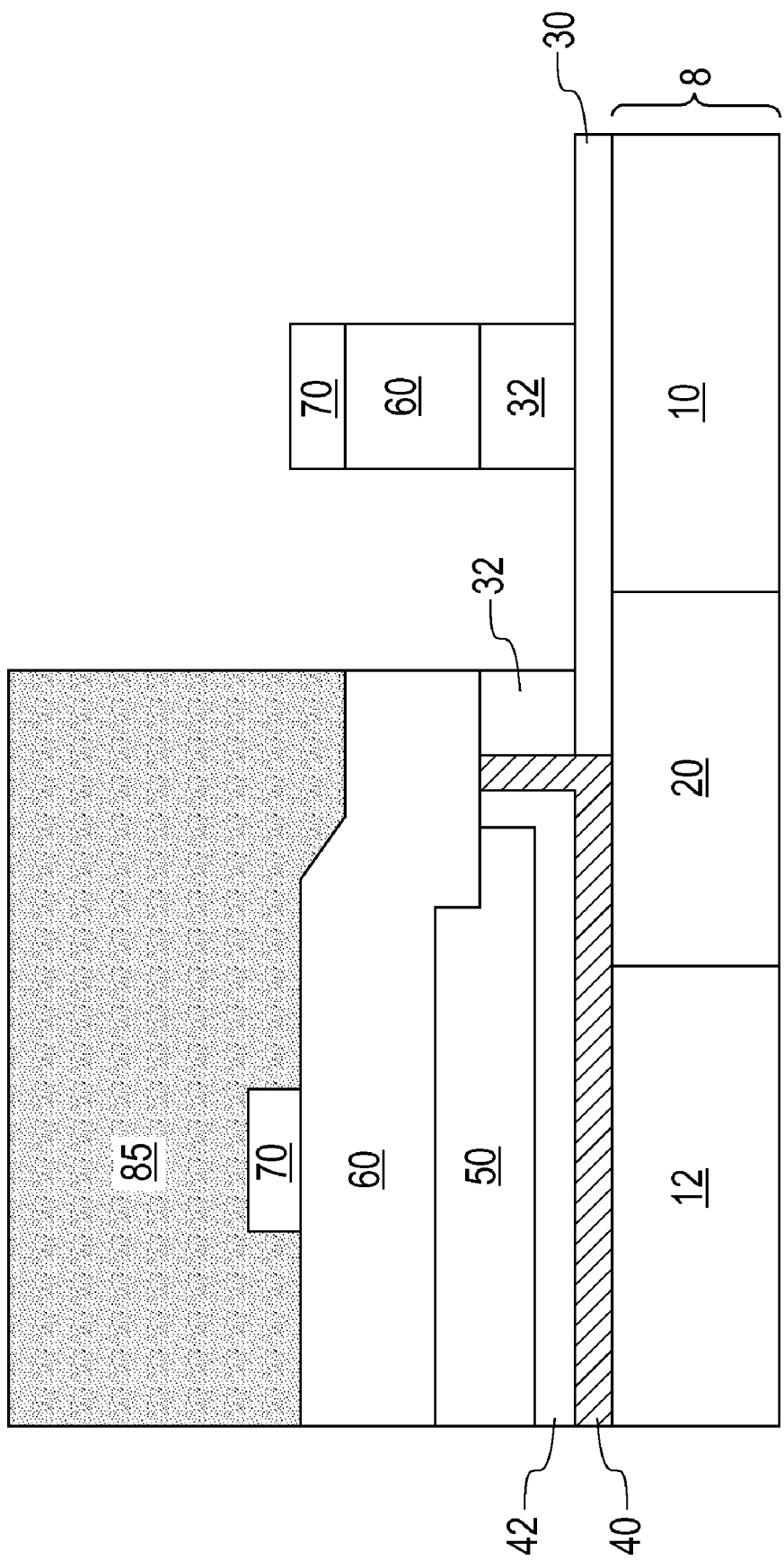

Referring to FIG. 13, a first gate electrode is formed by a fourth reactive ion etch (RIE) that etches the exposed portions of the second polysilicon layer 60 and the first polysilicon layer 32. Preferably, the fourth RIE stops on the top surface of the first gate dielectric 30. The structure under the fourth photoresist 85 is protected from the etch process.

Figure 14:
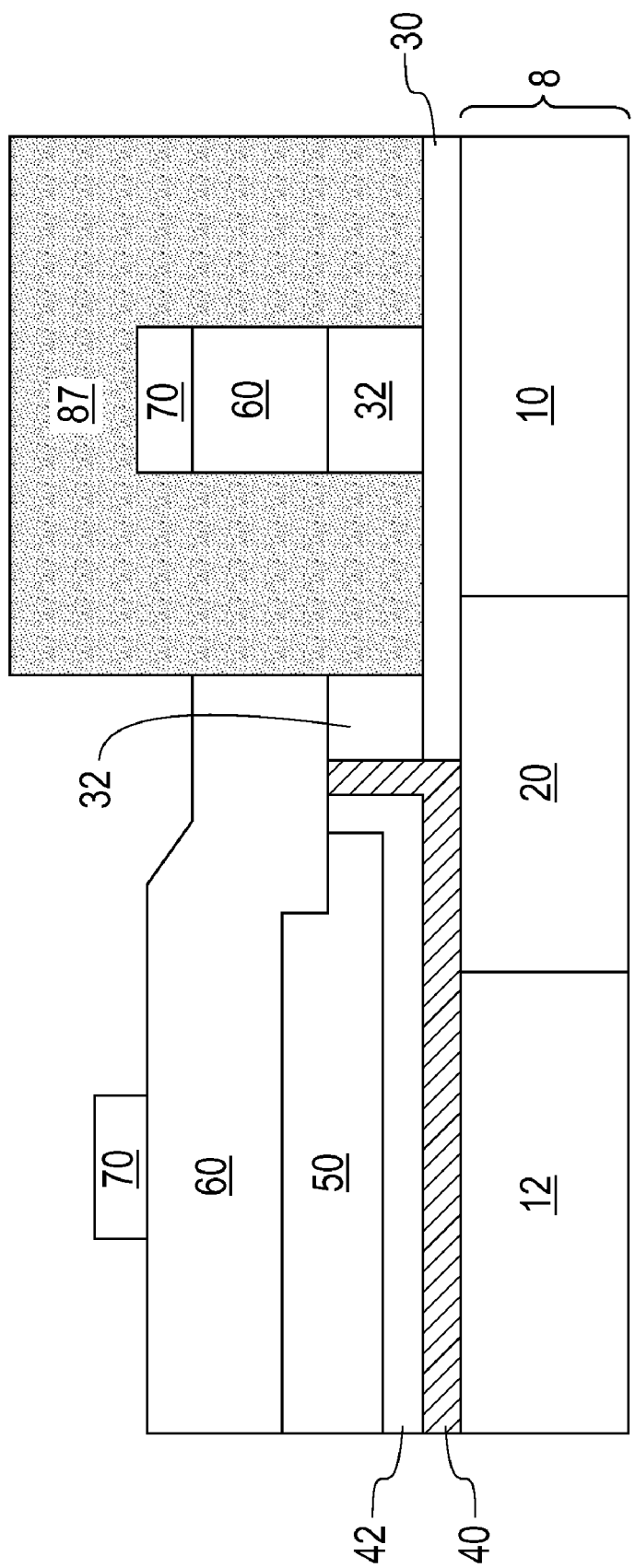

Referring to FIG. 14, a fifth photoresist 87 is applied and lithographically patterned to cover the structure over the first portion 10 of the semiconductor substrate 8. Preferably, the fifth photoresist 87 is patterned with enough overlap with the edge of the stack of the second polysilicon layer 60 and remaining first polysilicon layer 32 on top of the shallow trench isolation 20 such that the outer edges of the fifth photoresist 87 may be trimmed back by a trimming etch of the fifth photoresist 87. With a controlled overlay tolerance and the trimming etch, the edge of the fifth photoresist 87 may be self-aligned to the edge of the stack of the second polysilicon layer 60 and the remaining first polysilicon layer 32 on top of the shallow trench isolation 20 as shown in FIG. 14.

Figure 15:
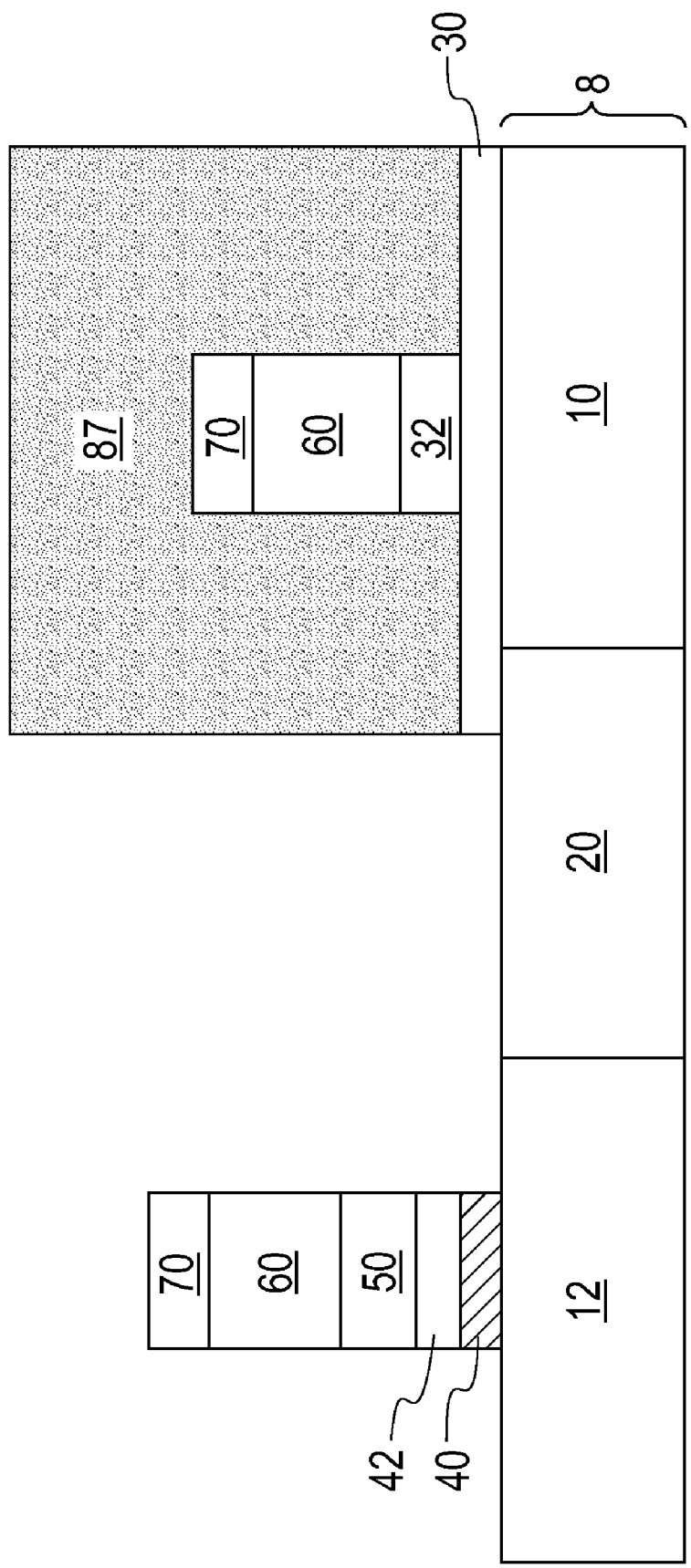

Referring to FIG. 15, a second gate electrode is formed over the second portion 12 of the semiconductor substrate 8 by etching the stack of the second polysilicon layer 60, a silicon-containing layer 50, a metal gate layer 42, and the second gate dielectric layer 40. Preferably, ion-bombardment of the second gate dielectric layer 40 with inert ion species such as Ar, Xe, and Kr precedes the etching of the second gate dielectric layer 40. The ion bombardment is used to loosen the high-K dielectric layer portion of the second dielectric layer 40 and thereby to facilitate subsequent etching.

Figure 16:
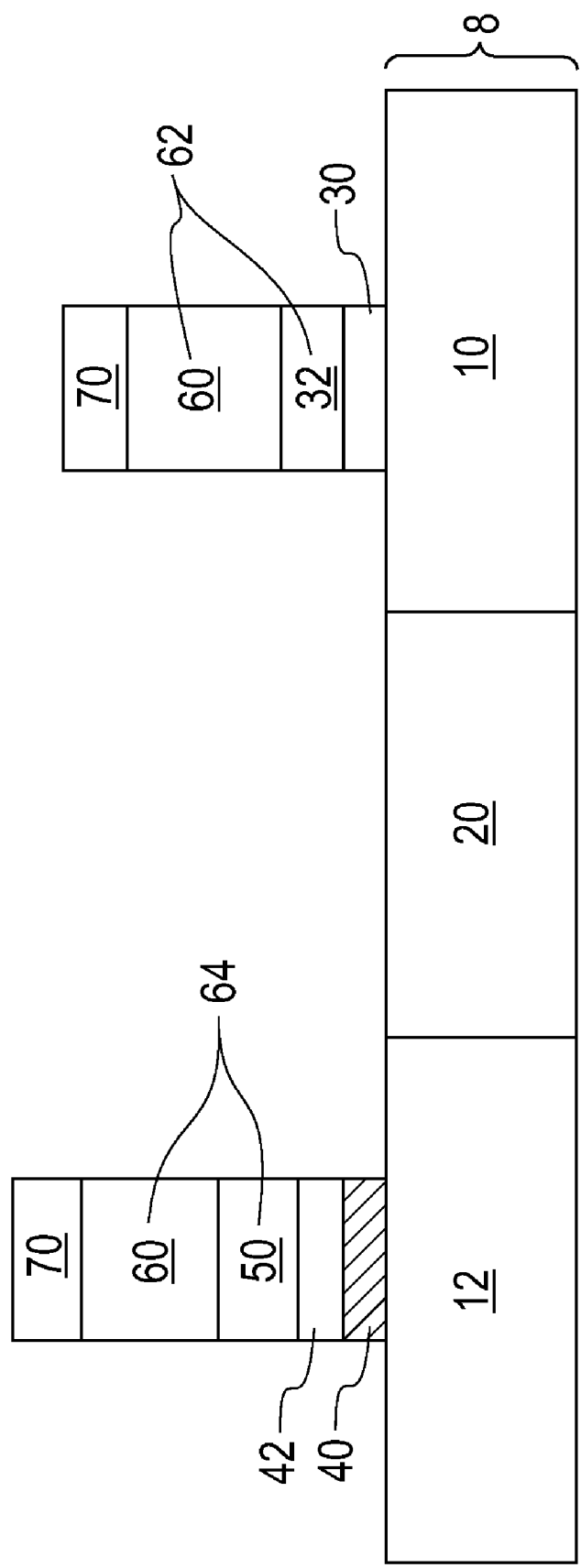

Referring to FIG. 16, the firth photoresist 87 is thereafter removed and the first gate dielectric layer 30 is etched either by a wet etch or by a reactive ion etch (RIE). The resulting structure according to the second embodiment of the present invention is identical to the structure shown in FIG. 10 according to the first embodiment of the present invention.

According to the third embodiment of the present invention, the initial processing steps corresponding to FIGS. 1-7 are identical to those according to the first embodiment of the present invention. Thereafter, the pattern in the third photoresist 83 is transferred into the stack comprising the ARC layer 81 and the gate cap dielectric layer 70 in exactly the same manner as in the second embodiment of the present invention as shown in FIG. 11. The remaining third photoresist 83' and the ARC layer 81 are thereafter removed.

Figure 17:
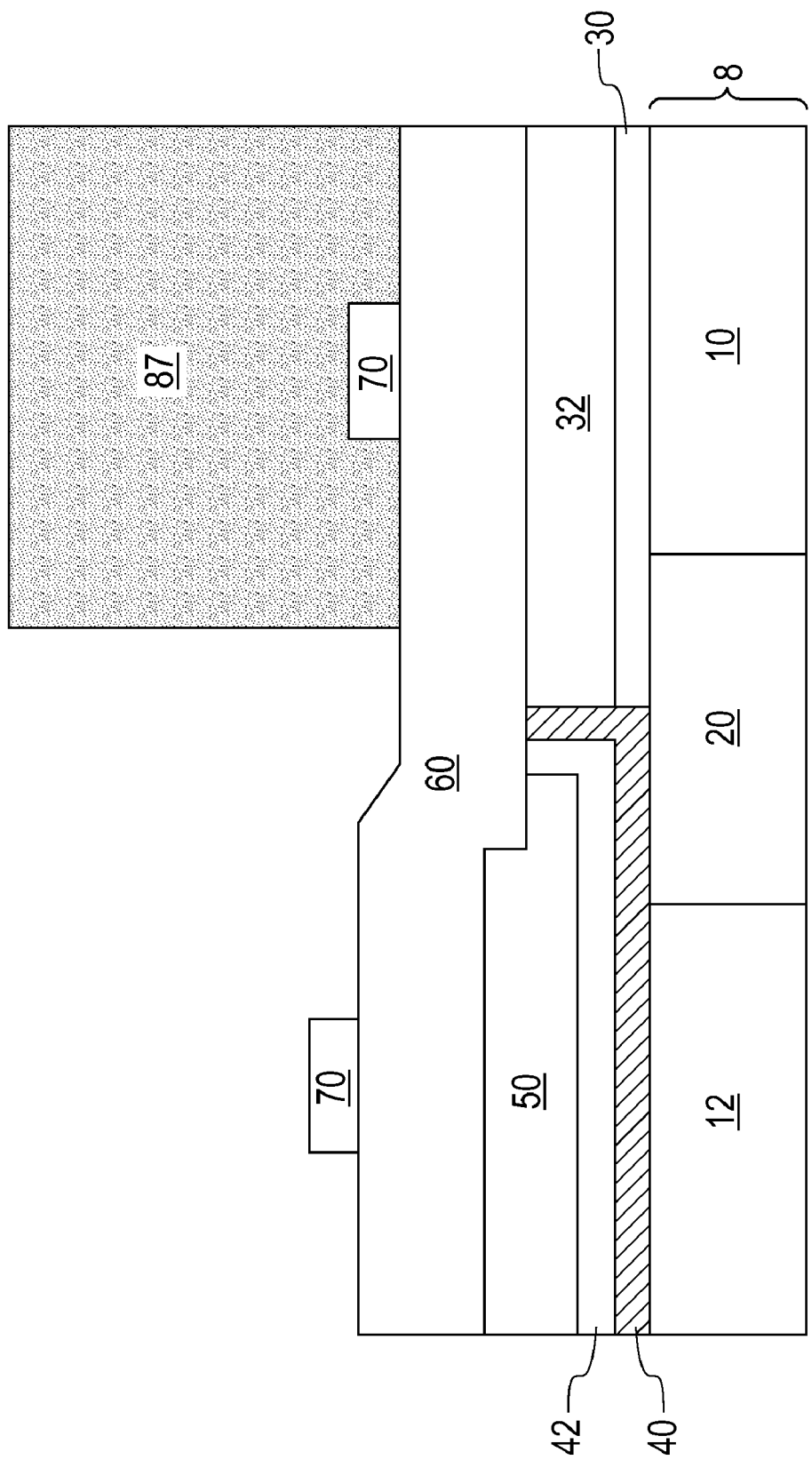

Referring to FIG. 17, a fifth photoresist 87 is applied over the patterned gate cap dielectric layer 70 and over the underlying second polysilicon layer 60. The fifth photoresist 87 is subsequently lithographically patterned so that the semiconductor structure over the first portion 10 of the semiconductor substrate 8 is covered, while the area over the second portion 12 is exposed. (A fourth photoresist has not been used yet according to the third embodiment at this point but the functional equivalence of the fifth photoresist 87 according to the third embodiment of the present invention as shown in FIG. 17 to the fifth photoresist 87 according to the second embodiment as shown in FIGS. 14-15 is conveyed by the same reference numeral and the same name across the second and third embodiments.) Preferably, the fifth photoresist 87 does not overlap the boundary between the remaining second gate dielectric layer 40 and the remaining first gate dielectric layer 30 so that boundary is outside the area of the patterned fifth photoresist 87.

Figure 18:
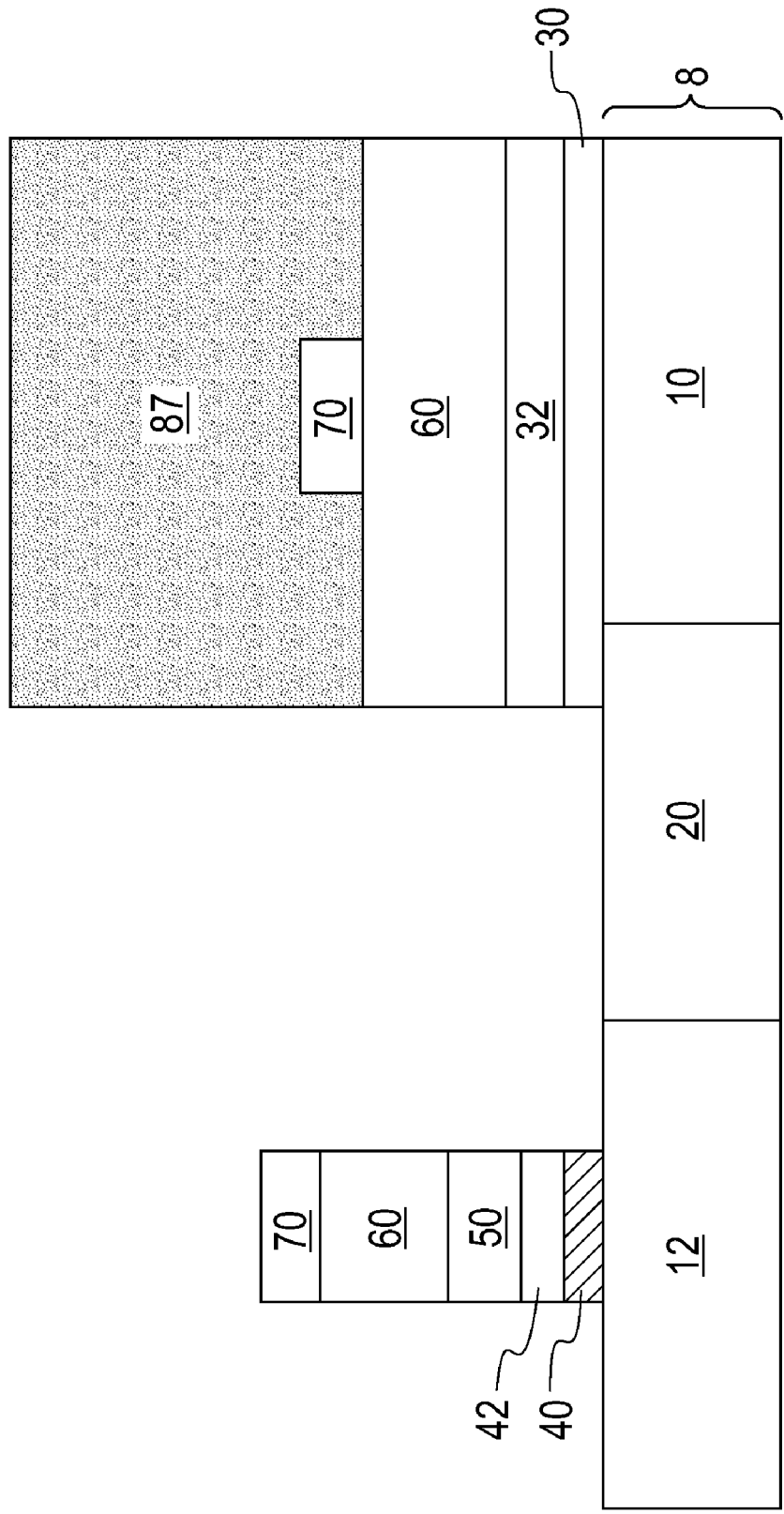

Referring to FIG. 18, the second gate electrode is formed by a fourth reactive ion etch (RIE) that etches the exposed portions of the second polysilicon layer 60, the silicon-containing layer 50, and the metal gate layer 42. Preferably, ion-bombardment of the second gate dielectric layer 40 with inert ion species such as Ar, Xe, and Kr is performed after the etching of the metal gate layer 42 and prior to the etching the second gate dielectric layer 40. The ion bombardment is used to loosen the high-K dielectric layer portion of the second dielectric layer 40 and thereby to facilitate subsequent etching. The second dielectric layer 40 is subsequently etched by another reactive ion etch. The structure under the fifth photoresist 87 is protected from the etch process.

Figure 19:
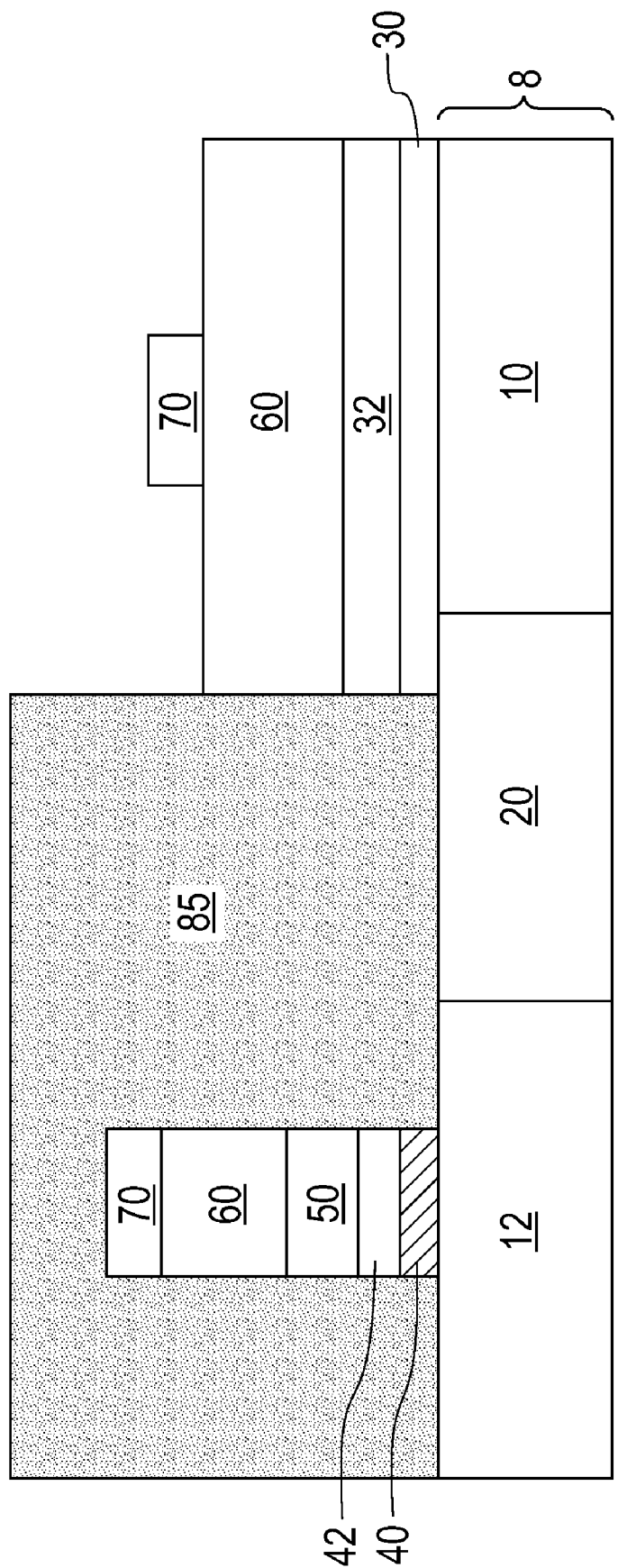

Referring to FIG. 19, a fourth photoresist 85 is applied and lithographically patterned to cover the structure over the second portion 12 of the semiconductor substrate 8. Preferably, the fourth photoresist 85 is patterned with enough overlap with the edge of the stack of the second polysilicon layer 60 and remaining first polysilicon layer 32 on top of the shallow trench isolation 20 such that the outer edges of the fourth photoresist 85 may be trimmed back by a trimming etch of the fourth photoresist 85. With a controlled overlay tolerance and the trimming etch, the edge of the fourth photoresist 85 may be self-aligned to the edge of the stack of the second polysilicon layer 60 and remaining first polysilicon layer 32 on top of the shallow trench isolation 20 as shown in FIG. 19.

Referring to FIG. 20, a first gate electrode is formed over the first portion 10 of the semiconductor substrate 8 by etching the stack of the second polysilicon layer 60, a first polysilicon layer 32, and the first gate dielectric layer 30. The second polysilicon layer 60 and the first polysilicon layer 32 are etched by a fifth reactive ion etch. The first gate dielectric layer 30 may be etched by a wet etch or by a reactive ion etch. The fourth photoresist 85 is thereafter removed.

Referring to FIG. 21, the resulting structure according to the third embodiment of the present invention is shown, which is identical to the structure shown in FIG. 10 according to the first embodiment of the present invention and to the structure shown in FIG. 16 according to the second embodiment of the present invention.

Figure 22:
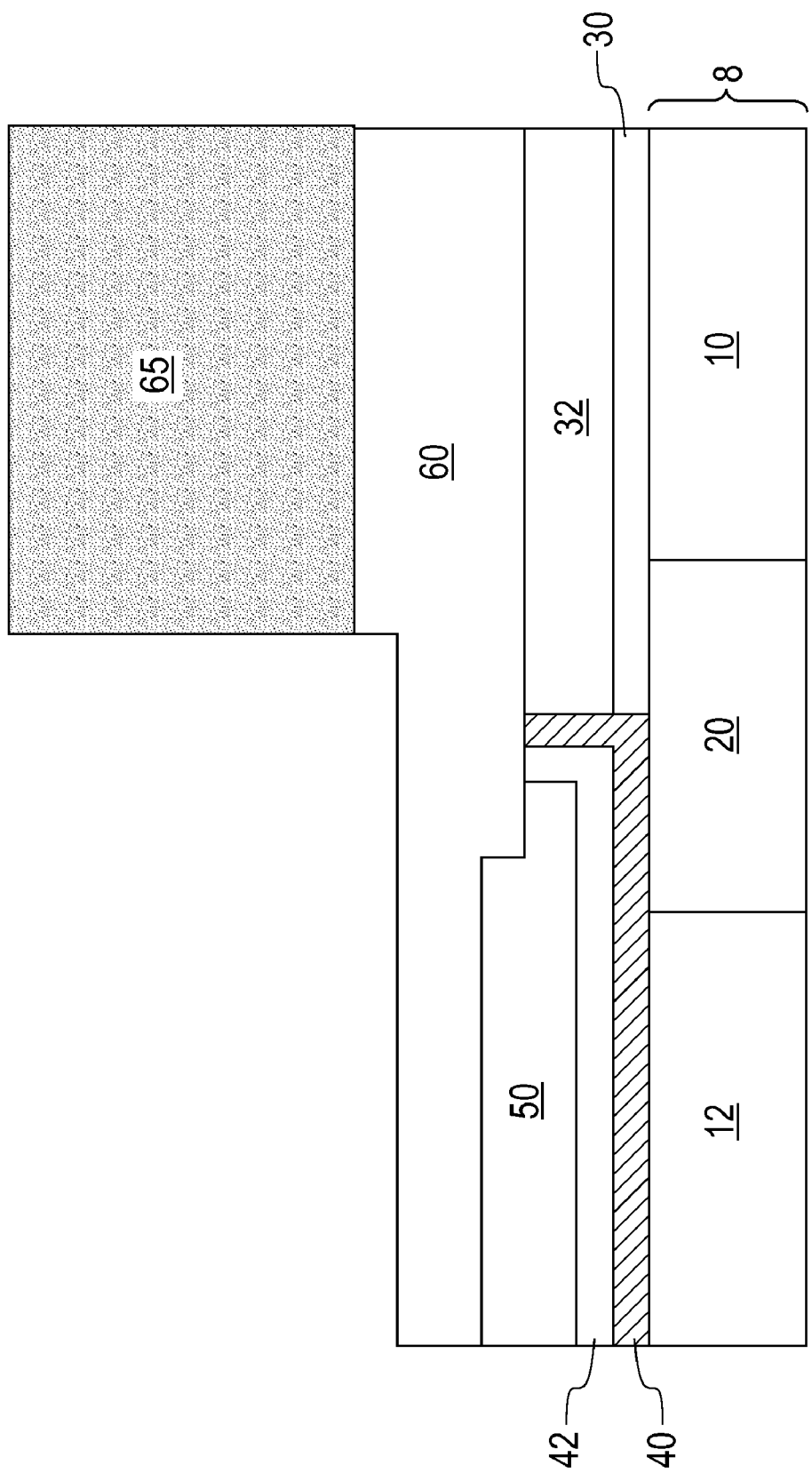
FIGS. 22-25 are sequential vertical cross-sectional views of the exemplary semiconductor structure according to the fourth embodiment of the present invention.

According to the fourth embodiment of the present invention, the initial processing steps corresponding to FIGS. 1-6 are identical to those according to the first embodiment of the present invention. Thereafter, a sixth photoresist 65 is applied over the surface of the second polysilicon layer 60. The sixth photoresist 65 is subsequently lithographically patterned so that the second polysilicon layer 60 is covered by the sixth photoresist over the first portion 10 of the semiconductor substrate 8 and is exposed over the second portion 12 of the semiconductor substrate 8. (The term, "sixth photoresist" does not refer to a cumulative count of photoresists used in the fourth embodiment but is used only to distinguish the sixth photoresist 65 from the fourth and fifth photoresists in the second and third embodiments since the sixth photoresist 65 serves a different function. A fourth photoresist or a fifth photoresist is not used according to the fourth embodiment of the present invention.) The exposed portion of the second polysilicon layer 60 is recessed by a reactive ion etch as shown in FIG. 22 while the patterned sixth photoresist 65 protects the semiconductor structure therebeneath. According to the fourth embodiment of the present invention, the thickness of the second polysilicon layer 60 is less over the second portion 12 compared to the thickness of that layer over the first portion 10 of the semiconductor substrate 10. The sixth photoresist 65 is thereafter removed.

Figure 23:
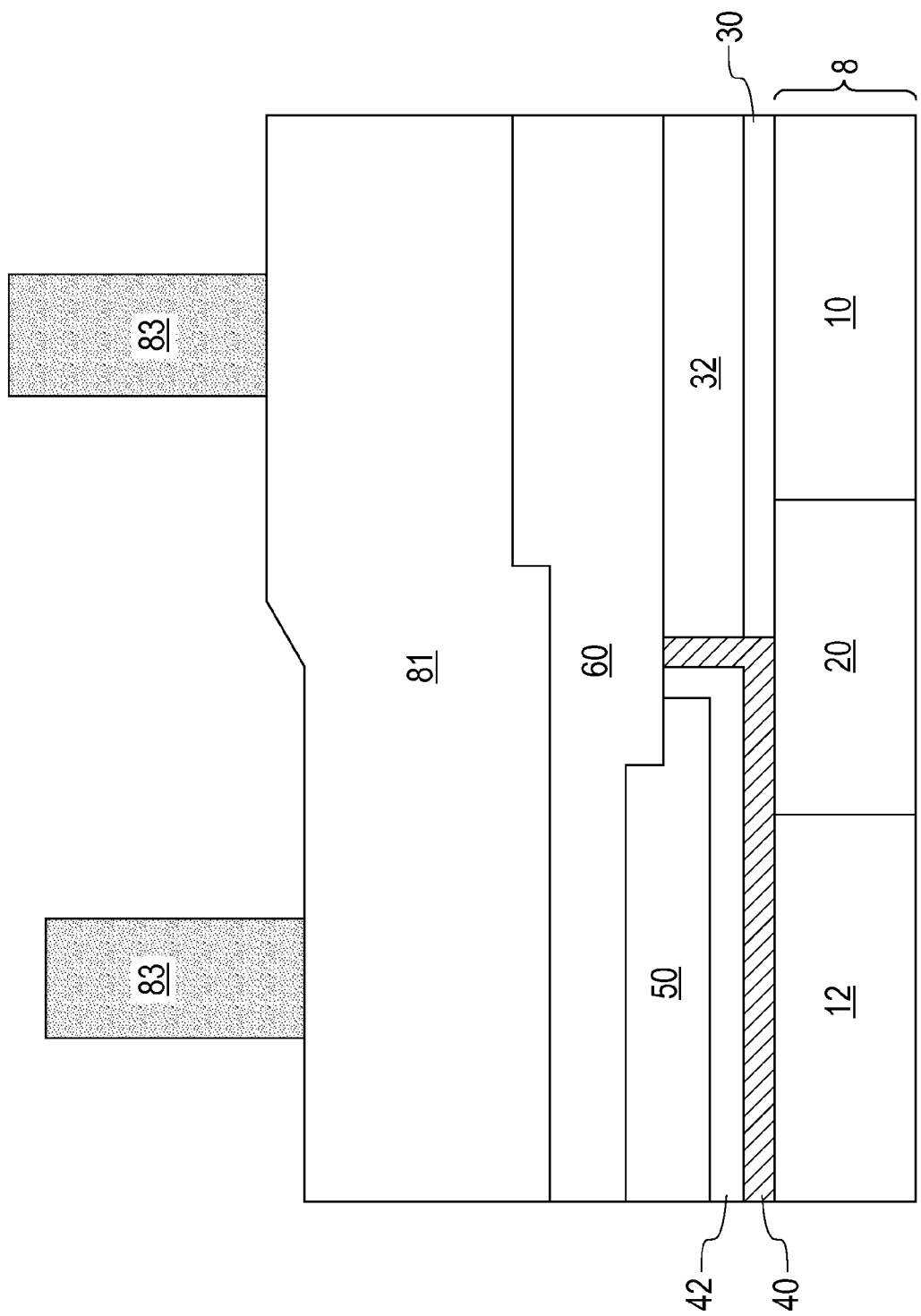

Referring to FIG. 23, an anti-reflective coating (ARC) layer 81 and a third photoresist 83 are applied over the top surface of the second polysilicon layer 60. The third photoresist 83 is subsequently lithographically patterned and as shown in FIG. 23. The pattern in the third photoresist 83 contains at least one first gate electrode over the first portion 10 and at least one second gate electrode over the second portion 12 of the semiconductor substrate 8. The thickness of the ARC layer 81 is in the range from about 60 nm to about 120 nm.

Figure 24:
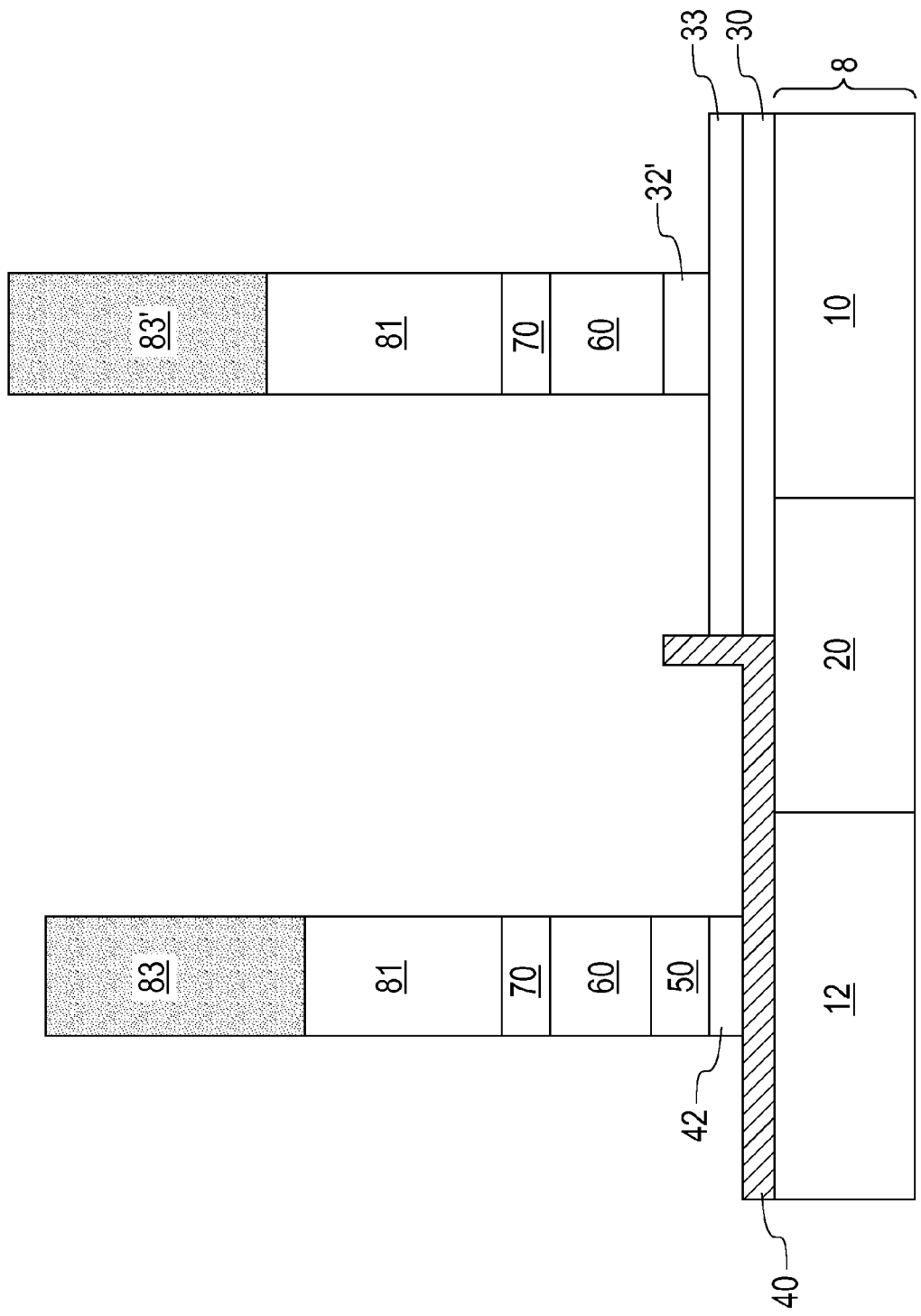

Referring to FIG. 24, the pattern in the third photoresist 83 is transferred into the underlying layers, specifically, into a stack comprising the ARC layer 81, into the second polysilicon layer 60, and partly into the first polysilicon layer 32 over the first portion 12 and into a stack comprising the ARC layer 81, the second polysilicon layer 60, the silicon-containing layer 50, and the metal gate layer 42 over the second portion 10 of the semiconductor substrate 8 by a third reactive ion etch (RIE). Preferably, the third RIE stops on the second gate dielectric layer 40 over the second portion 12 of the semiconductor substrate 8. Also preferably, the third RIE stops on top of first gate dielectric over the first portion 10 of the semiconductor substrate 8.

Preferably, a high temperature chemical driven plasma etch is used to remove the second gate dielectric layer 40. The temperature is about 150 C to 300 C. The plasma etch process used here should leave the first gate dielectric layer 30 un-attacked.

Figure 25:
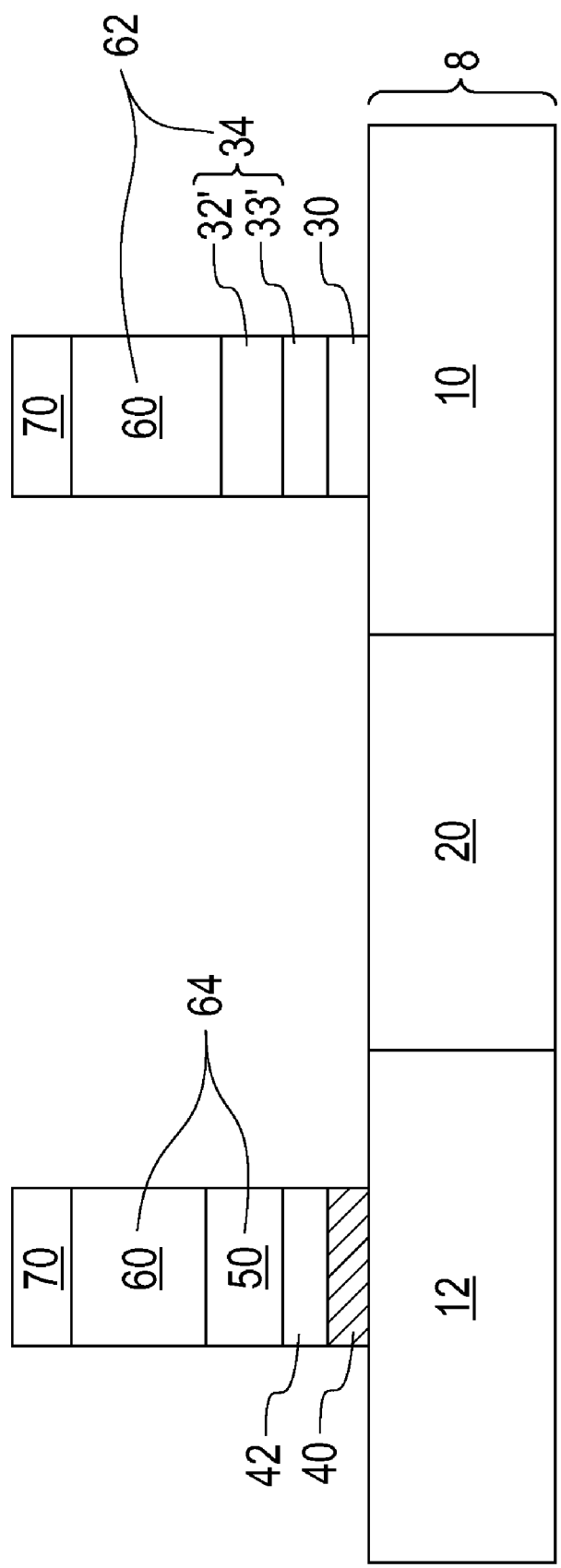

Referring to FIG. 25, the remaining third photoresist 83' and the ARC layer 81 are removed. The resulting exemplary semiconductor structure has a first gate electrode which comprises a first gate dielectric layer 30, and a first gate conductor stack 62. The first gate conductor stack 62 comprises a first gate polysilicon layer 32 and a second gate polysilicon layer 60. The resulting exemplary semiconductor structure also has a second gate electrode which comprises a second gate dielectric 40, a metal gate layer 42, and a second gate conductor stack 64. The second gate conductor stack 64 comprises a silicon-containing layer 50 and a second gate polysilicon 60. Preferably, the silicon-containing layer 50 is an amorphous silicon layer. Except for the composition of the first polysilicon layer by two layers and the absence of a gate cap dielectric layer, the structure shown in FIG. 25 according to the fourth embodiment of the present invention is identical to the structures according to the first through third embodiments of the present invention at equivalent stages.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure comprising:

forming a first stack of a first gate dielectric layer and a first polysilicon layer directly on a first portion of a semiconductor substrate;

forming a second stack of a second gate dielectric, a metal gate layer, and a silicon-containing layer directly on said first stack and on a second portion of a semiconductor substrate;

forming a second polysilicon layer directly on first polysilicon layer and directly on said silicon-containing layer;

forming a gate cap dielectric layer on said second polysilicon layer;

forming a patterning in said first polysilicon layer over said first portion and in said silicon-containing layer over said second portion;

masking said first portion with a photoresist;

transferring said pattern into said second gate dielectric layer over said second portion;

removing said photoresist from over said first portion; and transferring said pattern into said first gate dielectric layer from over said first portion.

2. The method of claim 1, wherein said second gate dielectric layer comprises a stack of an oxide-containing dielectric layer less than about 1 nm in thickness and a high-K dielectric layer, wherein said oxide-containing dielectric layer is an oxide layer or a oxynitride layer, and said first gate dielectric layer comprises a material selected from the group consisting of silicon oxide and silicon oxynitride.

3. The method of claim 2, wherein said first polysilicon layer is formed by deposition of a blanket polysilicon layer followed by a partial etch of said blanket polysilicon layer and has a thickness in the range from about 10 nm to about 50 nm, said second gate dielectric layer has a thickness in the range from about 2 nm to about 10 nm, said metal gate layer has a thickness in the range from about 2 nm to about 10 nm, and said gate cap dielectric layer has a thickness in the range from about 15 nm to about 60 nm.

4. The method of claim 2, wherein said silicon-containing layer is an amorphous silicon layer and has a thickness in the range from about 10 nm to about 50 nm, and said second polysilicon layer has a thickness in the range from about 40 nm to about 120 nm.

5. The method of claim 2, further comprising ion-bombarding said second dielectric layer after said masking of said first portion and prior to transferring said pattern into said second gate dielectric layer.

6. A method of manufacturing a semiconductor structure comprising:
   forming a first stack of a first gate dielectric layer and a first polysilicon layer directly on a first portion of a semiconductor substrate;
   forming a second stack of a second gate dielectric, a metal gate layer, and a silicon-containing layer directly on said first stack and on a second portion of a semiconductor substrate;
   forming a second polysilicon layer directly on first polysilicon layer and directly on said silicon-containing layer;
   forming a gate cap dielectric layer on said second polysilicon layer;
   forming a pattern into said gate cap dielectric;
   masking said second portion with a first photoresist;
   transferring said pattern into said first polysilicon layer from over said first portion;
   masking said first portion with a second photoresist;
   transferring said pattern into said metal gate layer and into said second gate dielectric layer over said second portion; and
   etching said first gate dielectric layer from said first portion.

7. The method of claim 6, wherein said second gate dielectric layer comprises a stack of an oxide-containing dielectric layer less than about 1 nm in thickness and a high-K dielectric layer, wherein said oxide-containing dielectric layer is an oxide layer or a oxynitride layer, and said first gate dielectric layer comprises a material selected from the group consisting of silicon oxide and silicon oxynitride.

8. The method of claim 7, wherein said first polysilicon layer is formed by deposition of a blanket polysilicon layer followed by a partial etch of said blanket polysilicon layer and has a thickness in the range from about 10 nm to about 50 nm, said second gate dielectric layer has a thickness in the range from about 2 nm to about 10 nm, said metal gate layer has a thickness in the range from about 2 nm to about 10 nm, and said gate cap dielectric layer has a thickness in the range from about 15 nm to about 60 nm.

9. The method of claim 7, wherein said silicon-containing layer is an amorphous silicon layer and has a thickness in the range from about 10 nm to about 50 nm, and said second polysilicon layer has a thickness in the range from about 40 nm to about 120 nm.

10. The method of claim 7, further comprising ion-bombarding said second dielectric layer after said masking of first portion and prior to transferring said pattern into said second gate dielectric layer over said second portion.

11. A method of manufacturing a semiconductor structure comprising:
   forming a first stack of a first gate dielectric layer and a first polysilicon layer directly on a first portion of a semiconductor substrate;
   forming a second stack of a second gate dielectric, a metal gate layer, and a silicon-containing layer directly on said first stack and on a second portion of a semiconductor substrate;
   forming a second polysilicon layer directly on first polysilicon layer and directly on said silicon-containing layer;
   forming a gate cap dielectric layer on said second polysilicon layer;
   forming a pattern into said gate cap dielectric;
   masking said first portion with a first photoresist;
   transferring said pattern into said metal gate layer and into said second gate dielectric layer over said second portion
   masking said second portion with a second photoresist;
   transferring said pattern into said first polysilicon layer from over said first portion; and
   etching said first gate dielectric layer from said first portion.

12. The method of claim 11, wherein said second gate dielectric layer comprises a stack of an oxide-containing dielectric layer less than about 1 nm in thickness and a high-K dielectric layer, wherein said oxide-containing dielectric layer is an oxide layer or a oxynitride layer, and said first gate dielectric layer comprises a material selected from the group consisting of silicon oxide and silicon oxynitride.

13. The method of claim 12, wherein said first polysilicon layer is formed by deposition of a blanket polysilicon layer followed by a partial etch of said blanket polysilicon layer and has a thickness in the range from about 10 nm to about 50 nm, said second gate dielectric layer has a thickness in the range from about 2 nm to about 10 nm, said metal gate layer has a thickness in the range from about 2 nm to about 10 nm, and said gate cap dielectric layer has a thickness in the range from about 15 nm to about 60 nm.

14. The method of claim 12, wherein said silicon-containing layer is an amorphous silicon layer and has a thickness in the range from about 10 nm to about 50 nm, and said second polysilicon layer has a thickness in the range from about 40 nm to about 120 nm.

15. The method of claim 12, further comprising ion-bombarding said second dielectric layer after said masking of said first portion with and prior to transferring said pattern into said second gate dielectric layer.

16. A method of manufacturing a semiconductor structure comprising:
   forming a first stack of a first gate dielectric layer and a first polysilicon layer directly on a first portion of a semiconductor substrate;
   forming a second stack of a second gate dielectric, a metal gate layer, and a silicon-containing layer directly on said first stack and on a second portion of a semiconductor substrate;
   forming a second polysilicon layer directly on first polysilicon layer and directly on said silicon-containing layer;
   masking said first semiconductor area with a first photoresist;
   recessing said second polysilicon layer from said second portion;
   lithographically forming a pattern containing at least one first gate electrode over said first portion and at least one second gate electrode over said second portion;
   transferring said pattern into said metal gate layer over said second portion and into an upper portion of said first polysilicon layer in said first portion while not etching a lower portion of said first polysilicon layer; and transferring said pattern into said second gate dielectric layer, said lower portion of said first polysilicon layer, and said first gate dielectric layer.

17. The method of claim 16, wherein said second gate dielectric layer comprises a stack of an oxide-containing dielectric layer less than about 1 nm in thickness and a high-K dielectric layer, wherein said oxide-containing dielectric layer is an oxide layer or a oxynitride layer, and said first gate dielectric layer comprises a material selected from the group consisting of silicon oxide and silicon oxynitride.

18. The method of claim 17, wherein said first polysilicon layer is formed by deposition of a blanket polysilicon layer followed by a partial etch of said blanket polysilicon layer and has a thickness in the range from about 10 nm to about 50 nm, said second gate dielectric layer has a thickness in the range from about 2 nm to about 10 nm, and said metal gate layer has a thickness in the range from about 2 nm to about 10 nm.

19. The method of claim 17, wherein said silicon-containing layer is an amorphous silicon layer and has a thickness in the range from about 10 nm to about 50 nm, and said second polysilicon layer has a thickness in the range from about 40 nm to about 120 nm.

20. The method of claim 17, further comprising ion-bombarding said second dielectric layer after said transferring of said pattern into said metal gate layer and prior to transferring said pattern into said second gate dielectric layer.

* * * * *